(12) United States Patent
Ukumori et al.

(10) Patent No.: US 10,761,143 B2
(45) Date of Patent: Sep. 1, 2020

(54) STORAGE AMOUNT ESTIMATION DEVICE, ENERGY STORAGE MODULE, STORAGE AMOUNT ESTIMATION METHOD, AND COMPUTER PROGRAM

(71) Applicant: GS Yuasa International Ltd., Kyoto (JP)

(72) Inventors: Nan Ukumori, Kyoto (JP); Yuichi Ikeda, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 0 days.

(21) Appl. No.: 16/618,561

(22) PCT Filed: May 25, 2018

(86) PCT No.: PCT/JP2018/020218
§ 371 (c)(1),
(2) Date: Dec. 2, 2019

(87) PCT Pub. No.: WO2018/221423
PCT Pub. Date: Dec. 6, 2018

(65) Prior Publication Data
US 2020/0166581 A1 May 28, 2020

(30) Foreign Application Priority Data

Jun. 2, 2017 (JP) .................................. 2017-110325
May 18, 2018 (JP) .................................. 2018-096637

(51) Int. Cl.
*G01R 31/396* (2019.01)
*G01R 31/3835* (2019.01)
(Continued)

(52) U.S. Cl.
CPC ....... *G01R 31/396* (2019.01); *G01R 31/3835* (2019.01); *H01M 10/48* (2013.01); *H01M 2004/027* (2013.01); *H01M 2004/028* (2013.01)

(58) Field of Classification Search
CPC . G01R 31/396; G01R 31/3835; H01M 10/48; H01M 2004/027; H01M 2004/028
See application file for complete search history.

(56) References Cited

U.S. PATENT DOCUMENTS

2014/0139189 A1* 5/2014 Izumi .................... H01M 10/48
320/134
2014/0320141 A1 10/2014 Kaburagi et al.
(Continued)

FOREIGN PATENT DOCUMENTS

JP    2013-105519 A    5/2013
JP    2013-158087 A    8/2013
(Continued)

OTHER PUBLICATIONS

International Searching Authority, International Search Report and Written Opinion for International Application No. PCT/JP2018/020218, dated Aug. 14, 2018, (6 pages), Japanese Patent Office, Tokyo, Japan.

*Primary Examiner* — Manuel L Barbee
(74) *Attorney, Agent, or Firm* — Alston & Bird LLP

(57) ABSTRACT

A storage amount estimation device is provided that can estimate a storage amount of an energy storage device containing an active material in which a storage amount-voltage characteristic exhibits a hysteresis, an energy storage module including the storage amount estimation device, a storage amount estimation method, and a computer program. An energy storage device contains an active material exhibiting hysteresis between a storage amount-voltage charge characteristic and a storage amount-voltage discharge characteristic in a positive electrode and/or a negative electrode, the active material generating a plurality of electrochemical reactions according to transition of charge-discharge. A BMU includes an acquisition unit that acquires a storage amount-voltage charge characteristic for reference and/or a storage amount-voltage discharge characteristic for reference based on the first characteristic, the second characteristic, and voltage history of the charge-discharge and an estimation unit that estimates the storage amount based on (Continued)

the voltage history of the charge-discharge, the third characteristic and/or the fourth characteristic, and the acquired voltage.

17 Claims, 14 Drawing Sheets

(51) Int. Cl.
*H01M 10/48* (2006.01)
*H01M 4/02* (2006.01)

(56) References Cited

U.S. PATENT DOCUMENTS

| | | |
|---|---|---|
| 2015/0369869 A1 | 12/2015 | Tsuzuku et al. |
| 2016/0254542 A1 | 9/2016 | Konishi et al. |
| 2017/0010327 A1 | 1/2017 | Nishiguchi et al. |

FOREIGN PATENT DOCUMENTS

| | | |
|---|---|---|
| JP | 2014-059206 A | 4/2014 |
| JP | 2014-163861 A | 9/2014 |
| JP | 2015-154639 A | 8/2015 |
| WO | WO-2014/045706 A1 | 3/2014 |
| WO | WO-2015/059778 A1 | 4/2015 |
| WO | WO 2015/129117 A1 | 9/2015 |

\* cited by examiner

STORAGE AMOUNT ESTIMATION DEVICE, ENERGY STORAGE MODULE, STORAGE AMOUNT ESTIMATION METHOD, AND COMPUTER PROGRAM

CROSS REFERENCE TO RELATED APPLICATIONS

This application is a national stage application, filed under 35 U.S.C. § 371, of International Application No. PCT/JP2018/020218, filed May 25, 2018, which claims priority to Japanese Application No. 2017-110325, filed Jun. 2, 2017, and Japanese Application No. 2018-096637, filed May 18, 2018, the contents of all of which as are hereby incorporated by reference in their entirety.

BACKGROUND

Technical Field

The present invention relates to a storage amount estimation device that estimates a storage amount such as state of charge (SOC) of an energy storage device, an energy storage module including the storage amount estimation device, a storage amount estimation method, and a computer program.

Description of Related Art

There is a demand for high capacity in a secondary battery for vehicle used in an electric vehicle, a hybrid vehicle, and the like and an industrial secondary battery used in a power storage device, a solar power generating system, and the like. Various investigations and improvements have been made so far, and it is difficult to achieve a higher capacity only by improving an electrode structure and the like. For this reason, development of a positive electrode material having a higher capacity than the current material is underway.

Conventionally, a lithium transition metal composite oxide having am $\alpha$-NaFeO$_2$ type crystal structure have been studied as a positive active material for a nonaqueous electrolyte secondary battery such as a lithium ion secondary battery, and a nonaqueous electrolyte secondary battery in which LiCoO$_2$ is used has widely been used. A discharge capacity of LiCoO$_2$ ranges from about 120 mAh/g to about 130 mAh/g.

When the lithium transition metal composite oxide is represented by LiMeO$_2$ (Me is a transition metal), desirably Mn was used as Me. In a case where a molar ratio Mn/Me of Mn in Me exceeds 0.5 with Mn contained as Me, a structure changes to a spinel type when charge is performed, and a crystal structure cannot be maintained. For this reason, charge-discharge cycle performance is significantly inferior.

Various LiMeO$_2$ type active materials in which the molar ratio Mn/Me of Mn in Me is less than or equal to 0.5 and the molar ratio Li/Me of Li to Me is substantially 1 have been proposed and put into practical use. A positive active material containing LiNi$_{1/2}$Mn$_{1/2}$O$_2$ and LiNi$_{1/3}$Co$_{1/3}$Mn$_{1/3}$O$_2$, which are the lithium transition metal composite oxide, has the discharge capacity of 150 mAh/g to 180 mAh/g.

In contrast to the LiMeO$_2$ type active material, there is known what is called a lithium-excess active material containing a lithium transition metal composite oxide in which the molar ratio Mn/Me of Mn in Me exceeds 0.5 and the composition ratio Li/Me of Li to the ratio of transition metal (Me) is greater than 1.

A lithium-excess type Li$_2$MnO$_3$-based active material has been studied as the high-capacity positive electrode material. This material has a property of a hysteresis in which voltage and an electrochemical characteristic with respect to the same state of charge (SOC) change depending on a charge history and a discharge history.

A method for estimating the SOC in a secondary battery includes an OCV method (voltage reference) for determining the SOC based on a correlation (SOC-OCV curve) in which tan open circuit voltage (OCV) and the SOC of the secondary battery are correlated with each other a one-to-one manner and a current integration method for determining the SOC by integrating a charge-discharge current value of the secondary battery.

When an electrode material having the hysteresis is used, it is difficult to estimate the SOC by the OCV method because the voltage is not uniquely decided with respect to the SOC. Because the SOC-OCV curve is not uniquely decided, it is difficult to predict dischargeable energy and chargeable energy at a certain point of time.

When the SOC is calculated by the current integration method, the following equation (1) is used.

$$SOC_i = SOC_{i-1} + I_i \times \Delta t_i / Q \times 100 \quad (1)$$

$SOC_i$: current SOC
$SOC_{i-1}$: previous SOC
I: current value
$\Delta t$: time interval
Q: battery capacity (available capacity)

When the current integration is continued for a long time, a measurement error of the current sensor is accumulated. The battery capacity decreases with time. Even if the battery capacity is estimated from usage history and a current electrical characteristic, an estimation error affects an SOC estimation error of the current integration method. For this reason, the estimation error of the SOC estimated by the current integration method increases with time. Conventionally, an OCV reset in which the SOC is estimated by the OCV method to reset the error accumulation is performed when the current integration is continued for a long time.

Even in the energy storage device in which the electrode material having the hysteresis is used, an error is accumulated when the current integration is continued. However, because the voltage is not uniquely decided with respect to the SOC, it is difficult to estimate the SOC by the OCV method (to perform the OCV reset).

Thus, it is difficult to accurately estimate the SOC in the energy storage device by the current SOC estimation technique.

In a secondary battery control device of JP-A-2013-105519, a relationship between the SOC and the OCV in a discharge process is stored as discharging OCV information for each switching SOC that is the SOC when the charge is switched to the discharge. The secondary battery control device is configured to calculate the SOC in the discharge process of the secondary battery based on the switching SOC when the charge is actually switched to the discharge and the discharging OCV information.

In a charge state estimation device of JP-A-2014-59206, a full charge characteristic, a complete discharge characteristic, and a plurality of SOC-OCV characteristics that divide a region between these characteristics at equal intervals are stored in a table while associated with a movement value of each characteristic. $\Delta$SOC is obtained based on a current accumulation amount due to charge-discharge, a movement amount is obtained based on the previous movement value, $\Delta$SOC, and a predetermined coefficient, the SOC-OCV characteristic to be used is selected based on the movement amount, and the SOC is estimated from the OCV.

BRIEF SUMMARY

In the secondary battery control device of JP-A-2013-105519, an SOC-OCV curve during the discharge is selected from the voltage reached by the charge, and the SOC is estimated based on the SOC-OCV curve and the current voltage. In the secondary battery control device, the SOC cannot be estimated based on the voltage of a charge process. When the charge-discharge is repeated with a complicated pattern, the secondary battery can hardly be monitored with high accuracy.

In the charge state estimation device of JP-A-2014-59206, not the hysteresis due to the active material, but the hysteresis due to internal resistance or polarization of the battery is considered. The case caused by the active material is larger than the case caused by the internal resistance or the polarization of the battery in a difference in voltage between the charge curve and the discharge curve with respect to the same SOC. The estimation method of JP-A-2014-59206 cannot be adopted to an energy storage device exhibiting the hysteresis due to an active material.

An object of the present invention is to provide a storage amount estimation device that can estimate the storage amount of the energy storage device containing the active material in which a storage amount-voltage value characteristic exhibits the hysteresis, an energy storage module including the storage amount estimation device, a storage amount estimation method, and a computer program.

As used herein, the storage amount means the SOC, a power dischargeable amount, and the like.

According to one aspect of the present invention, a storage amount estimation device estimates a storage amount of an energy storage device containing an active material in a positive electrode and/or a negative electrode, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic. The storage amount estimation device includes a first acquisition unit that acquires a third characteristic that is a storage amount-voltage charge characteristic and/or a fourth characteristic that is a storage amount-voltage discharge characteristic for reference based on the first characteristic, the second characteristic, and voltage history of the charge-discharge. The third characteristic and the fourth characteristic are for reference in estimating the storage amount by an acquired voltage. An estimation unit estimates the storage amount based on the voltage history of the charge-discharge, the third characteristic and/or the fourth characteristic, and the acquired voltage.

The "first characteristic" and the "second characteristic" can be calculated from the "storage amount-potential charge characteristic" and the "storage amount-potential discharge characteristic" of the positive electrode or the negative electrode. Thus, the "first characteristic" and the "second characteristic" "based on the first characteristic, the second characteristic, and the voltage history during the charge-discharge" include the "storage amount—potential charge characteristic" and the "storage amount—potential discharge characteristic".

With the above configuration, the storage amount of the energy storage device containing the active material in which the storage amount-voltage value characteristic exhibits the hysteresis can be estimated well based on the voltage history of the charge-discharge.

Figure 1:
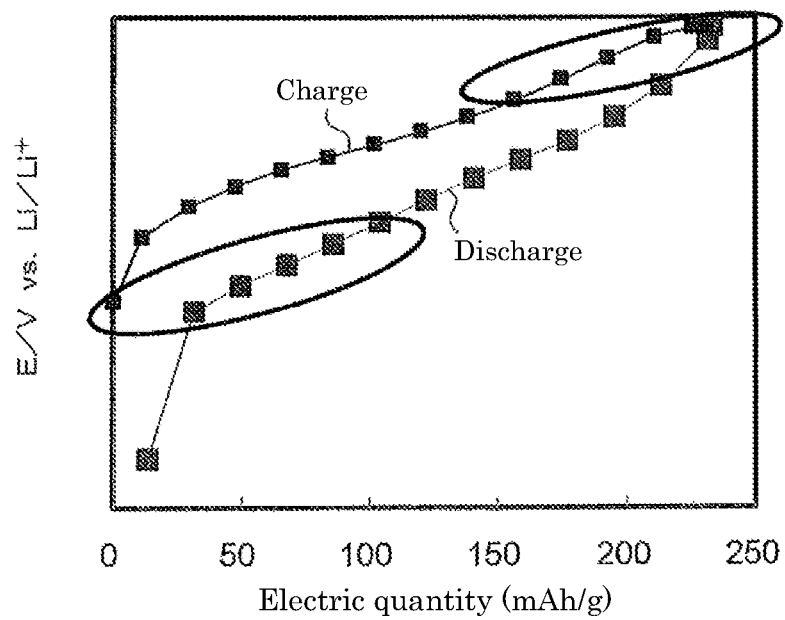
FIG. 1 is a graph illustrating a result in which a relationship between an electric quantity and a charge-discharge potential is obtained with respect to a Li-excess active material.

DETAILED DESCRIPTION OF VARIOUS EMBODIMENTS (Outline of Embodiment)

A storage amount estimation device according to an embodiment estimates a storage amount of an energy storage device containing an active material in a positive electrode and/or a negative electrode, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic. The storage amount estimation device includes a first acquisition unit that acquires a third characteristic that is a storage amount-voltage charge characteristic and/or a fourth characteristic that is a storage amount-voltage discharge characteristic for reference based on the first characteristic, the second characteristic, and voltage history of the charge-discharge. The third characteristic and the fourth characteristic are for reference in estimating the storage amount by an acquired voltage. An estimation unit estimates the storage amount based on the voltage history of the charge-discharge, the third characteristic and/or the fourth characteristic, and the acquired voltage.

In the above configuration, the first characteristic and the second characteristic are acquired.

In a single electrode, in a whole potential range, in consideration of one electrochemical reaction (oxidation, reduction) and another electrochemical reaction (oxidation, reduction), the third characteristic or the fourth characteristic is obtained based on the first characteristic, the second characteristic, and the voltage history of the charge-discharge. For example, whether a region where one electrochemical reaction is generated is reached grasped based on the voltage increase or decrease during the charge-discharge.

As used herein, "one electrochemical reaction is generated" includes the case where "an electrochemical reaction is simultaneously generated as a group". "Another electrochemical reaction occurs" includes the case where "an electrochemical reaction is simultaneously generated as a group".

During the charge and discharge, the storage amount can be estimated in the whole region.

Unlike the SOC estimation method of Patent Document 2 in which the SOC-OCV characteristic is selected based on the current accumulation amount, the third characteristic or the fourth characteristic is calculated based on the voltage history of the charge-discharge, so that a calculation error is small.

Only the first characteristic and the second characteristic are actually measured, and the first characteristic and the second characteristic may be estimated, so that a workload is small.

When the third characteristic or the fourth characteristic is calculated according to degradation of the energy storage device, only the first characteristic and the second characteristic are actually measured or estimated, and the workload is small during a usage period of the energy storage device.

The storage amount of the high-capacity energy storage device containing the active material having the storage amount-voltage characteristic exhibiting the hysteresis can easily and satisfactorily be estimated.

Because of the use of the voltage, the storage amount is not limited to the SOC, and the current amount of energy, such as electric energy, which is stored in the energy storage device, can be estimated. The dischargeable energy up to SOC 0% and the charge energy required up to SOC 100% can be predicted based on the charge-discharge characteristic.

In the power storage amount estimation device described above, the first acquisition unit may acquire the third characteristic or the fourth characteristic in a plurality of regions defined by the voltage that changes according to transition of the charge-discharge using the first characteristic or the second characteristic.

In the above configuration, the third characteristic or the fourth characteristic can accurately be calculated using the first characteristic or the second characteristic based on the reaction generated during the charge or the discharge in each voltage region.

The storage amount estimation device includes a second acquisition unit that acquires the voltage of the energy storage device and a setting unit that sets the voltage acquired after the voltage acquired by the second acquisition unit is greater than a first threshold to a reference voltage. The first acquisition unit may acquire the third characteristic and/or the fourth characteristic based on the reference voltage.

In the above configuration, the third characteristic or the fourth characteristic can accurately be calculated based on one electrochemical reaction generated between the first threshold and the reference voltage.

In the storage amount estimation device, the setting unit may store the reference voltage in a storage unit, and update the acquired voltage to the reference voltage when the voltage acquired by the second acquisition unit is greater than the reference voltage previously stored in the storage unit.

In the above configuration, the third characteristic or the fourth characteristics can more accurately be calculated based on the oxidation amount (or the reduction amount) due to one electrochemical reaction generated between the maximum reference voltage reached in the charge-discharge history and the first threshold.

In the storage amount estimation device, the first acquisition unit may set the storage amount of the first characteristic at the reference voltage to an upper limit in a region from the first threshold to the reference voltage, and acquire the third characteristic using the second characteristic.

In the above configuration, only another electrochemical reaction is generated as a discharge reaction in a high voltage region where one electrochemical reaction is generated. One electrochemical reaction and another electrochemical reaction are generated as the charge reaction. The discharge capacity of another electrochemical reaction in the region can be regarded as the amount of charge of another electrochemical reaction. Another electrochemical reaction and the potential correspond approximately to 1:1, and can be regarded as a reversible reaction. That is, the same second characteristic can be used when the storage amount is estimated by the charged state and the discharged state.

In this region, a difference (Δ storage amount) in storage amount between the first characteristic and the second characteristic at the reference voltage corresponds to one electrochemical reaction. One electrochemical reaction and another electrochemical reaction are substantially independently generated. The reaction amount of one electrochemical reaction corresponds to the Δ storage amount, and hardly affects another electrochemical reaction.

The storage amount of the first characteristic at the reference voltage is set to the upper limit, and the third characteristic can be calculated with high accuracy using the second characteristic.

In the storage amount estimation device, the first acquisition unit may set the storage amount at the first threshold to an upper limit in a region from the first threshold to a second threshold smaller than the reference voltage, and acquire the third characteristic using the first characteristic.

At this point, the storage amount at the first threshold=(the storage amount at the reference voltage of the first characteristic)−{(the storage amount at the reference voltage of the second characteristic)−(the storage amount at the first threshold of the second characteristic)}.

In the above configuration, one electrochemical reaction is not generated during the charge in this region, and the first characteristic is based on another electrochemical reaction.

In the region from the second threshold value to the first threshold value, a discharge capacity based on another electrochemical reaction is equal to an amount of charge. Another electrochemical reaction and the potential correspond approximately to 1:1, and can be regarded as a reversible reaction. The storage amount at the first threshold is obtained from the above equation. The third characteristic can accurately be calculated using the first characteristic with (the charged amount, the first threshold) as the starting point.

The energy storage module of the embodiment includes the energy storage device and the above storage amount estimation device.

In the above configuration, the storage amount of the energy storage device can accurately be estimated.

According to another aspect of the present invention, a storage amount estimation device estimates a storage amount of an energy storage device containing an active material in a positive electrode and/or a negative electrode, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic. The storage amount estimation method includes: storing the first characteristic, the second characteristic, and voltage history of the charge-discharge in a storage unit; acquiring a third characteristic that is a storage amount-voltage charge characteristic for reference in estimating the storage amount from an acquired voltage and/or a fourth characteristic that is a storage amount-voltage discharge characteristic for reference; and estimating the storage amount based on the voltage history of the charge-discharge, the third characteristic and/or the fourth characteristic, and the acquired voltage.

In the above configuration, the storage amount can be estimated in the whole region during the charge and the discharge.

Only the first characteristic and the second characteristic are actually measured, and the first characteristic and the second characteristic may be estimated, so that a workload is small.

When the third characteristic and the fourth characteristic are calculated according to degradation of the energy storage device, only the first characteristic and the second characteristic are actually measured or estimated, and the workload is small during a usage period of the energy storage device.

The storage amount of the high-capacity energy storage device containing the active material having the storage amount-voltage characteristic exhibiting the hysteresis can easily and satisfactorily be estimated.

According to still another aspect of the present invention, a computer program causing a computer that estimates a storage amount of an energy storage device containing an active material in a positive electrode and/or a negative electrode to perform pieces of processing, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic, the pieces of processing include: acquiring a third characteristic that is a storage amount-voltage charge characteristic for reference in estimating the storage amount from an acquired voltage and/or a fourth characteristic that is a storage amount-voltage discharge characteristic for reference by referring to the first characteristic, the second characteristic, and voltage history of the charge-discharge; acquiring voltage at the energy storage device; and estimating the storage amount based on the voltage history of the charge-discharge, the third characteristic and/or the fourth characteristic, and the acquired voltage.

Hereinafter, the present invention will specifically be described based on the drawings illustrating the embodiment.

An energy storage device according to the embodiment generates the plurality of electrochemical reactions according to the transition of the charge-discharge, and contains the active material exhibiting the hysteresis between the first characteristic and the second characteristic during the generation of one electrochemical in at least one of the positive electrode and the negative electrode.

Hereinafter, the case where the active material of the energy storage device is a Li-excess $LiMeO_2$—$Li_2MnO_3$ solid solution containing Ni and an electric quantity is the SOC will be described as an example.

FIG. 1 is a graph illustrating a result in which a relationship between an electric quantity and a charge-discharge potential is obtained using a lithium cell of a counter electrode Li with respect to a Li-excess active material. A horizontal axis indicates an electric quantity (mAh/g), and a vertical axis indicates a charge-discharge potential E (a potential based on an equilibrium potential V vs $Li/Li^+$:$Li/Li^+$), the upper side of the axis indicates a high numerical value. At this point, the electric quantity corresponds to the SOC.

As illustrated in FIG. 1, an increase (charge) in SOC and a decrease (discharge) in SOC differ from each other in the potential. That is, the potentials for the same SOC are different from each other, and have the hysteresis. For the active material, a high SOC side is smaller than a low SOC side in the potential difference with respect to the same SOC, and the hysteresis is small.

Figure 2:
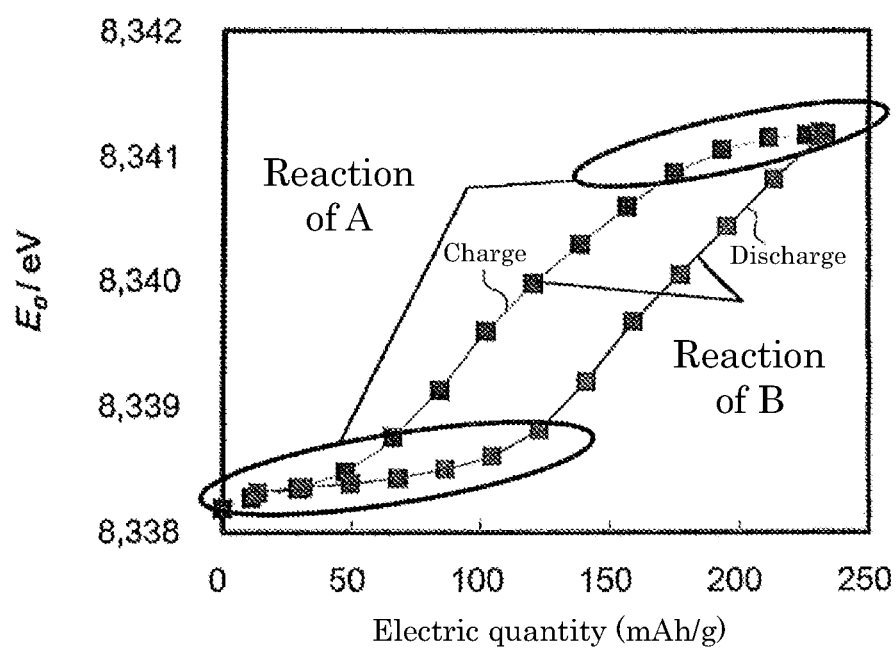
FIG. 2 is a graph illustrating a transition of K absorption edge energy of Ni in a Li-excess active material calculated by X-ray absorption spectroscopy (XAFS measurement) with respect to the electric quantity.

FIG. 2 is a graph illustrating a transition of K absorption edge energy of Ni in the Li-excess active material calculated by X-ray absorption spectroscopy (XAFS measurement) with respect to the electric quantity. The horizontal axis indicates the electric quantity (mAh/g), and the vertical axis indicates K absorption edge energy $E_0$ (eV) of Ni.

Figure 3:
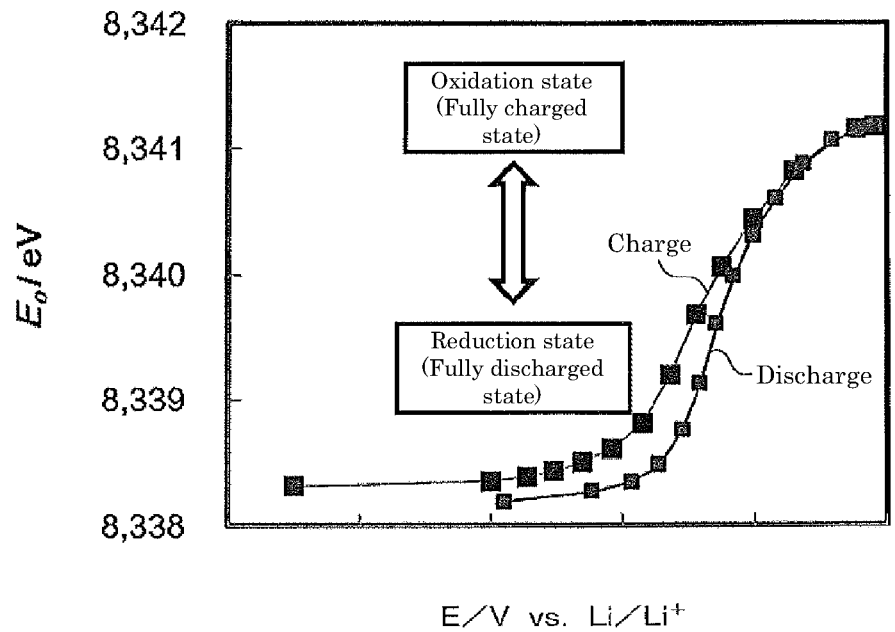
FIG. 3 is a graph illustrating the transition of the K absorption edge energy of Ni during charge-di s charge.

FIG. 3 is a graph illustrating the transition of the K absorption edge energy of Ni during the charge-discharge. The horizontal axis indicates the charge-discharge potential E (V vs Li/Li+), and a right side of the axis indicates a higher numerical value. The vertical axis indicates the K absorption edge energy E0 (eV) of Ni.

As illustrated in FIG. 2, in the high SOC region, the transition of the K absorption edge energy of Ni in a charge reaction is not matched with the transition of the energy in a discharge reaction. In the low SOC region, the transition of the energy in the discharge reaction is not matched with the transition of the energy in the charge reaction. That is, it can be seen that a redox reaction other than Ni having the hysteresis is generated on the charge side of the high SOC and the discharge side of the low SOC (this is referred to as a reaction of A). The reaction of A is an oxidation reaction in the high SOC region, and is a reductive reaction in the low SOC region.

In a middle SOC region, the K absorption edge energy of Ni in the charge reaction and discharge reaction changes substantially linearly with respect to the SOC.

As illustrated in FIG. 3, in the high SOC region, the charge and the discharge are substantially matched with each other in the K absorption edge energy of Ni. When the K absorption edge energy of Ni is the same, it is considered that a valence of Ni is equal, that a valence change of Ni corresponds substantially to the potential in a one-to-one manner in the potential range, and that Ni reacts reversibly. That is, in the SOC region, the redox reaction having a small hysteresis indicated by the SOC-OCP characteristic is mainly generated (this is referred to as a reaction of B). The OCP means an open circuit potential.

In the SOC region, a reaction amount of B is larger than a reaction amount of A, and resultantly the hysteresis is smaller than that in the low SOC region.

In this case, the description is given by focusing only on the oxidation-reduction reaction of Ni. However, the reaction of B is not limited to the oxidation-reduction reaction of Ni. The reaction of B refers to a reaction with the small hysteresis of SOC-OCP in one or a group of reactions generated by the active material according to the transition of the charge-discharge.

In the embodiment, voltage (first threshold V1) at which the oxidation amount and reduction amount of the reaction of B are small is obtained by an experiment. The lower voltage in the region where the reaction of B is mainly generated is obtained by an experiment. Existence of the hysteresis is substantially switched at the voltage. The oxidation amount and the reduction amount of the reaction of B are considered to be small.

When the OCV can be measured as the first threshold V1, V1 may be constant. When a closed circuit voltage (CCV) is measured as V1, the update may be performed by lowering V1 according to a degree of degradation associated with the use of the energy storage device. An increase in internal resistance and an increase in deviation of capacity balance can be cited as an example of a cause of the degradation of the energy storage device. The deviation of the capacity balance means that a difference between an amount of side reaction except for a charge-discharge reaction in the positive electrode and an amount of side reactions except for the charge-discharge reaction in the negative electrode is generated to incompletely charge one of the positive electrode and the negative electrode, and the positive and negative electrodes have different capacities in which charged ions can reversibly enter and leave the electrode. In a typical lithium ion battery, because the side reaction amount in the positive electrode is smaller than the side reaction amount in the negative electrode, when the "deviation of capacity balance" increases, the negative electrode cannot fully be charged and the electric quantity that can be reversibly taken out from the energy storage device decreases.

The voltage acquired after the voltage becomes higher than V1 is set to an upper reference voltage (Vup). Vup is updated when the acquired voltage is greater than the previously acquired Vup.

The first characteristic and the second characteristic are acquired and stored. Preferably, the first characteristic and the second characteristic are a full charge SOC-OCV characteristic for charging from a fully discharged state to a fully charged state and a full discharge SOC-OCV characteristic for discharging from a fully charged state to a fully discharged state.

The third characteristic or the fourth characteristic accumulation is calculated based on the first characteristic, the second characteristic, and the voltage history of the charge-discharge. The reaction of A is generated during the charge of the high SOC (high potential) and the discharge of the low SOC (low potential). Based on this, the third characteristic or the fourth characteristic is obtained using the first characteristic and the second characteristic.

The SOC is estimated based on the charge-discharge history, the third characteristic or the fourth characteristic, and the current voltage.

As used herein, the "current voltage" means the voltage at a point of time of the estimation when the SOC is estimated during the use of the energy storage device, and the "current voltage" means the voltage at the point of time or the voltage after leaving for a predetermined time when the SOC at the point of time of a use end is estimated after the use of the energy storage device.

The case, where the storage amount is the SOC and the reaction of A having the large hysteresis is generated in the positive electrode, will be described below.

The fully charged SOC-OCV (full first SOC-OCV) and the fully discharged SOC-OCV (full second SOC-OCV) of the positive electrode are obtained from the fully charged SOC-OCP (full first SOC-OCP) and the fully discharged SOC-OCP (full second SOC-OCP) of the cell at low current. Alternatively, the full first SOC-OCP and the second SOC-OCP are obtained from the beginning.

The positive-electrode potential corresponding to Vup is set to Vup', and the positive-electrode potential corresponding to V1 is set to V1'.

Figure 4:
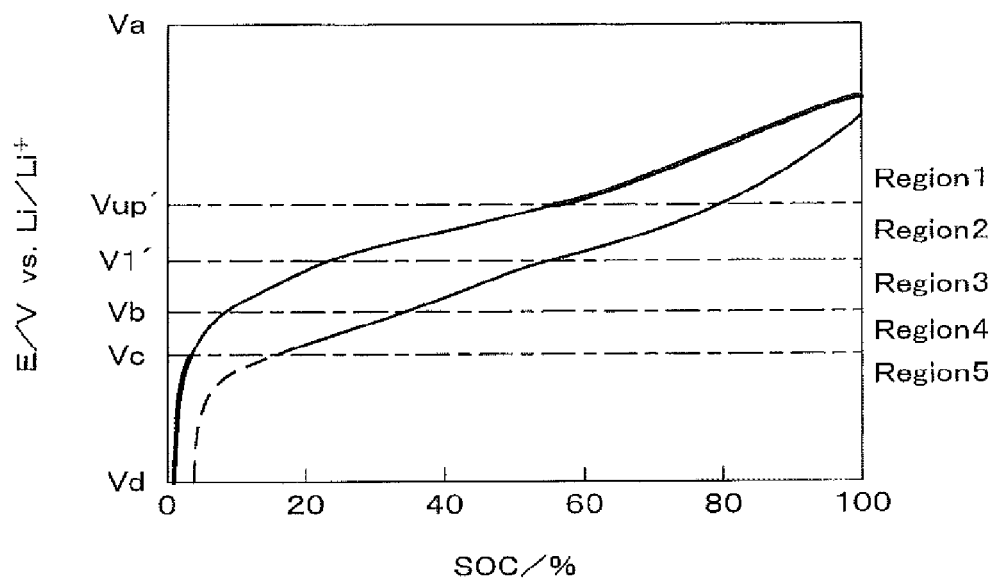
FIG. 4 is a graph illustrating a first SOC-OCP and a second SOC-OCP, a third SOC-OCP and a fourth SOC-OCP in a region 1 and a region 5.

FIG. 4 is a graph illustrating the first SOC-OCP and the second SOC-OCP. In FIG. 4, an upper black line indicates the first SOC-OCP, and a lower black line indicates the second SOC-OCP.

As illustrated in Table 1 below, the OCP is divided into five potential ranges (Va>Vb>Vc>Vd) from the top to the bottom of the vertical axis based on a height. A shape of the first SOC-OCP is referred to as Scha, and a shape of the second SOC-OCP is referred to as Sdis.

TABLE 1

| | Potential range | Third SOC-OCP | Fourth SOC-OCP | Starting point |
|---|---|---|---|---|
| Region 1 | Va-Vup' | | Scha | Without slide |
| Region 2 | Vup'-V1' | | Sdis | (SOC at Vup', Vup') |
| Region 3 | V1'-Vb | Scha | Scha or Sdis | (SOC at V1', V1') |
| Region 4 | Vb-Vc | | | |
| Region 5 | Vc-Vd | Scha | Sdis | Without slide |

For a region 1, the reference charge SOC-OCP (third SOC-OCP) and the reference discharge SOC-OCP (fourth SOC-OCP) are common, and the first SOC-OCP is used. For a region 5, the first SOC-OCP is used as the third SOC-OCP, and the second SOC-OCP is used as the fourth SOC-OCP. That is, the shape of the third SOC-OCP is Scha, and the shape of the fourth SOC-OCP is Sdis.

Hereinafter, a black thick line indicates the third SOC-OCP based on Scha, and a broken line indicates the fourth SOC-OCP based on Sdis.

Figure 5:
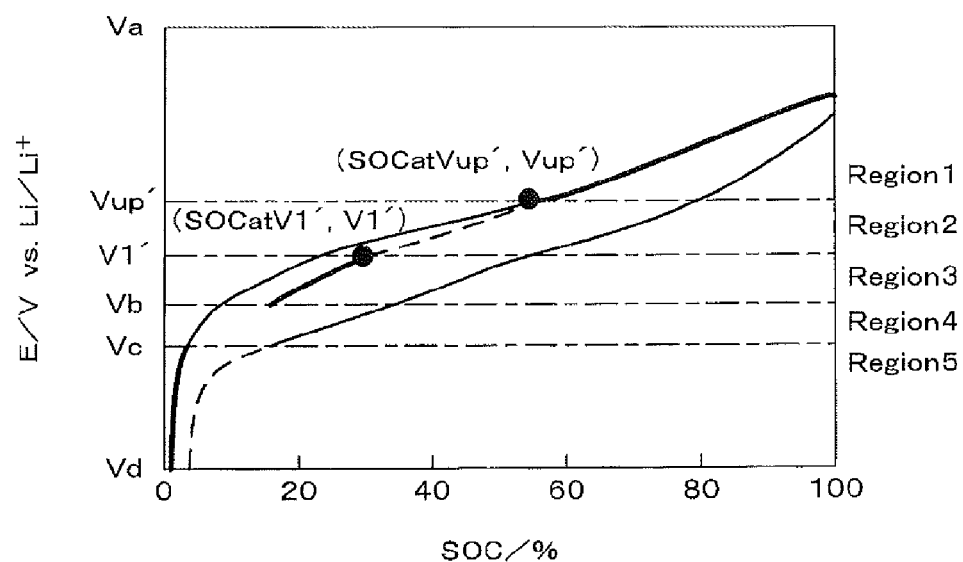
FIG. 5 is a graph illustrating how to obtain the third SOC-OCP and the fourth SOC-OCP in a region 2 and a region 3.

FIG. 5 is a graph illustrating how to obtain the third SOC-OCP and the fourth SOC-OCP in a region 2 and a region 3.

In the region 2, the SOC (SOC at Vup') of the first SOC-OCP at Vup' is set to an upper limit, and the third SOC-OCP is produced using the second SOC-OCP. That is, the second SOC-OCP is translated so as to pass through a starting point (SOC at Vup', Vup'), thereby calculating the third SOC-OCP. The shape of the third SOC-OCP is Sdis. In this region, the reaction of A is not generated during the discharge, but the shape of the second SOC-OCP is based on the reaction of B, so that the third SOC-OCP based on the reaction of B is obtained by shifting the second SOC-OCP. The fourth SOC-OCP is common to the third SOC-OCP.

In the region 3, the SOC at V1' is set to the upper limit, and the third SOC-OCP is calculated using the first SOC-OCP. That is, the first SOC-OCP is translated so as to pass through the starting point (SOC at V1', V1'), thereby producing the third SOC-OCP. The shape of the third SOC-OCP is Scha. SOC at V1' is calculated by the following equation.

SOC at V1'=(SOC in Vup' of first SOC-OCP)−
{(SOC in Vup' of second SOC-OCP)−(SOC in V1' of second SOC-OCP)}

In the region 3, although both the reaction of A and the reaction of B are generated, the first SOC-OCP and the second SOC-OCP differs from each other in the oxidation amount due to the reaction of A based on Vup'. When Vup' is noble and an oxidant amount due to the reaction of A is large, the fourth SOC-OCP is obtained using the second SOC-OCP having a high proportion of the reaction of A. When Vup' is base and the oxidant amount due to the reaction of A is small, the fourth SOC-OCP is obtained using the first SOC-OCP having a low proportion of the reaction of A.

That is, in the fourth SOC-OCP of the region 3, a difference between the SOC maximum difference (ΔSOCmax) between the second SOC-OCP and the first SOC-OCP and the difference (ΔSOC) at Vup' is larger than 0.7×ΔSOCmax, Sdis is used. Scha is used when the difference is less than or equal to 0.7×ΔSOCmax. That is, Sdis is used when the reduction amount of the oxidant based on the reaction of A is large, and Scha is used when the reduction amount is small. Although Scha and Sdis are selectively used according to the oxidant amount in the reaction of A, a curved shape may be produced by a combination of Scha and Sdis according to the oxidant amount.

Figure 6:
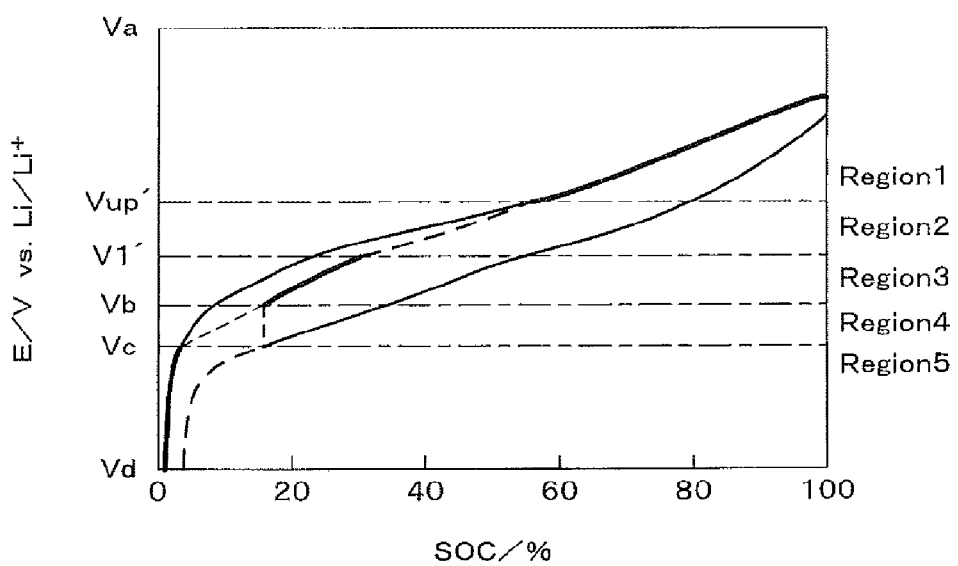
FIG. 6 is a graph illustrating how to obtain the third SOC-OCP and the fourth SOC-OCP in a region 4.

FIG. 6 is a graph illustrating how to obtain the third SOC-OCP and the fourth SOC-OCP in a region 4.

In the region 4, the third SOC-OCP and the fourth SOC-OCP are produced using interpolation calculation so as to connect the region 3 and the region 5. In FIG. 6, the region 3 and the region 5 are linearly connected to each other. A thin broken line indicates the third SOC-OCP and the fourth SOC-OCP.

The obtained third SOC-OCP and fourth SOC-OCP are converted into the third SOC-OCV and the fourth SOC-OCV based on the potential of the negative electrode.

For example, when the charge is rested in the voltage range corresponding to the region 2 according to the charge-discharge history, the third SOC-OCV in the region 2 is calculated, and the SOC corresponding to the acquired voltage is read.

Preferably the voltage lower than V1 is set to Vlow to correct Vup under a predetermined condition that the voltage of the energy storage device becomes lower than V1 after becoming higher than V1. Vlow is updated when the acquired voltage is lower than the previously acquired Vlow.

A difference between the SOC maximum difference between the first SOC-OCP and the second SOC-OCP and the difference in Vup' is calculated as a surplus oxidation amount. Based on the surplus oxidation amount, the first SOC-OCP, and the second SOC-OCP, an amount reduced by the reduction is calculated between Vlow' and V1. Vup' is corrected based on the difference between the surplus oxidation amount and the amount.

First Embodiment

A first embodiment will be described below by taking an energy storage module mounted on a vehicle as an example.

Figure 7:
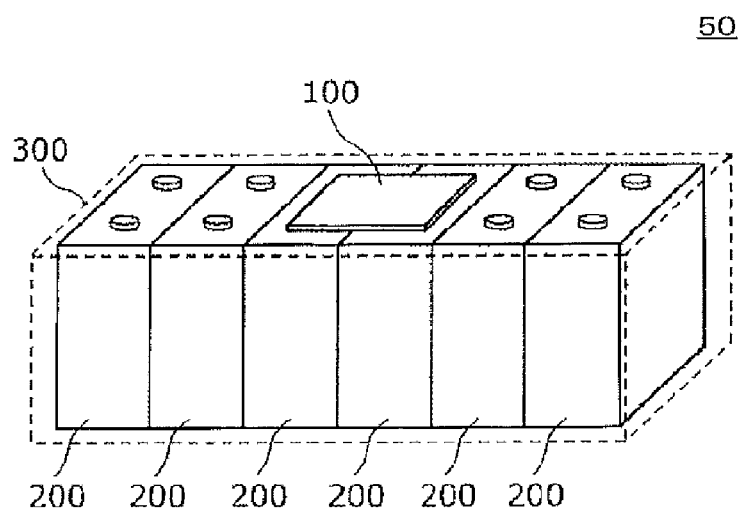
FIG. 7 is a perspective view illustrating an example of an energy storage module.

FIG. 7 illustrates an example of the energy storage module. An energy storage module 50 includes a plurality of energy storage devices 200, a monitoring device 100, and a case 300 that stores the plurality of energy storage devices 200 and the monitoring device 100. The energy storage module 50 may be used as a power source for an electric vehicle (EV) or a plug-in hybrid electric vehicle (PHEV).

The energy storage device 200 is not limited to a prismatic cell, but may be a cylindrical cell or a pouch cell.

The monitoring device 100 may be a circuit board disposed opposite to the plurality of energy storage devices 200. The monitoring device 100 monitors a state of the energy storage device 200. The monitoring device 100 may be a storage amount estimation device. Alternatively, a computer or a server that is connected to the monitoring device 100 in a wired or wireless manner may perform the storage amount estimation method based on information output from the monitoring device 100.

Figure 8:
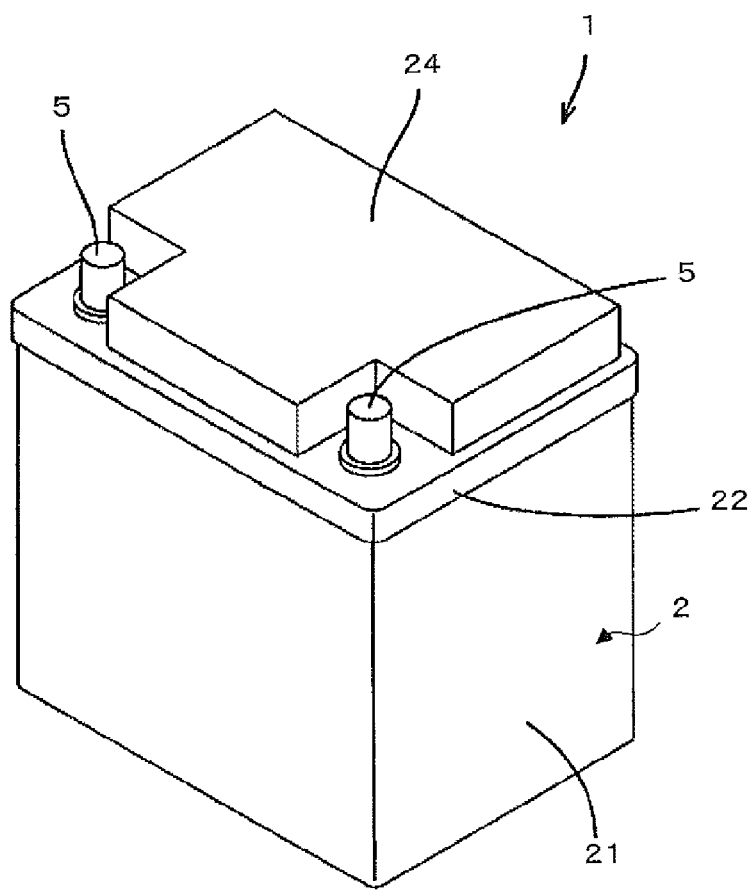
FIG. 8 is a perspective view illustrating another example (battery module) of the energy storage module.
Figure 9:
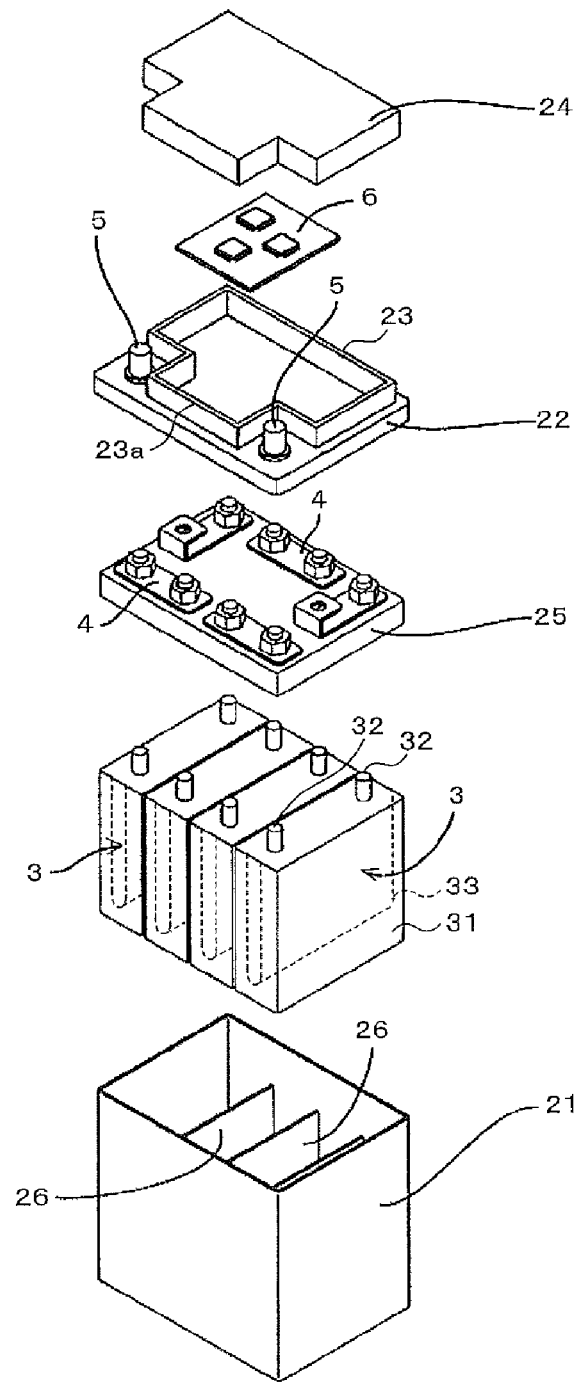
FIG. 9 is an exploded perspective view of the battery module in FIG. 8.
Figure 10:
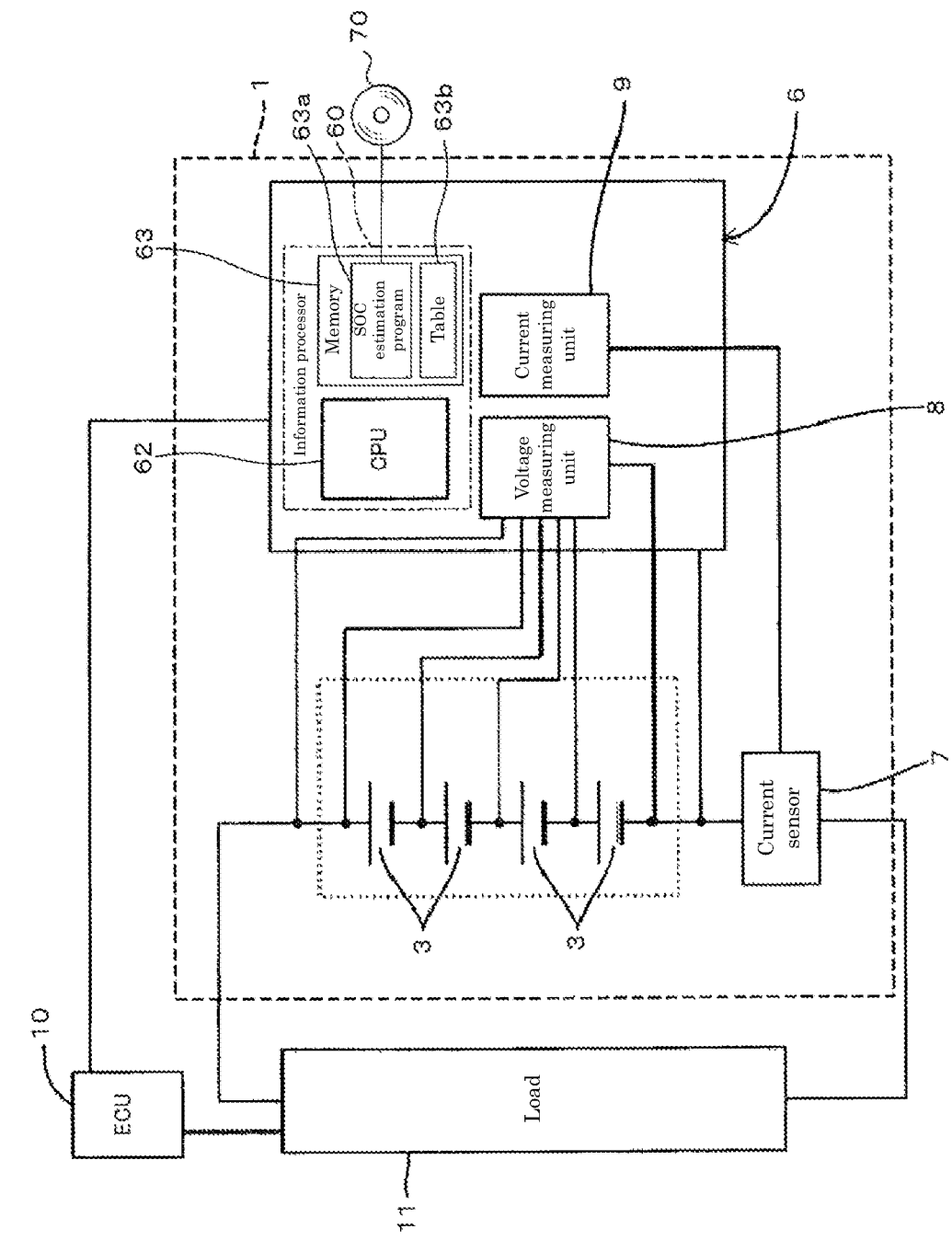
FIG. 10 is a block diagram of the battery module.

FIG. 8 illustrates another example of the energy storage module. The energy storage module (hereinafter, referred to as a battery module) 1 may be a 12-volt power supply or a 48-volt power supply that is suitably mounted on an engine vehicle. FIG. 8 is a perspective view of the battery module 1 for the 12-V power supply, FIG. 9 is an exploded perspective view of the battery module 1, and FIG. 10 is a block diagram of the battery module 1.

The battery module 1 includes a rectangular parallelepiped case 2. A plurality of lithium ion secondary batteries (hereinafter referred to as batteries) 3, a plurality of bus bars 4, a battery management unit (BMU) 6, and a current sensor 7 are accommodated in the case 2.

The battery 3 includes a rectangular parallelepiped case 31 and a pair of terminals 32, 32 that is provided on one side surface of the case 31 and having different polarities. The case 31 houses an electrode assembly 33 in which a positive electrode plate, a separator, and a negative electrode plate are laminated.

At least one of a positive active material included in the positive electrode plate and a negative active material included in the negative electrode plate of the electrode assembly 33 generates at least two electrochemical reactions depending on a transition of charge-discharge. A hysteresis of a storage amount-voltage characteristic exhibiting during the generation of one electrochemical reaction is larger than a hysteresis during the generation of the other electrochemical reaction.

Examples of the positive active material include Li-excess active materials such as the above $LiMeO_2$—$Li_2MnO_3$ solid solution, a $Li_2OLiMeO_2$ solid solution, a $Li_3NbO_4$—$LiMeO_2$ solid solution, a $Li_4WO_5$—$LiMeO_2$ solid solution, a $Li_4TeO_5$—$LiMeO_2$ solid solution, a $Li_3SbO_4$—$LiFeO_2$ solid solution, a $Li_2RuO_3$—$LiMeO_2$ solid solution, and a $Li_2RuO_3$—$Li_2MeO_3$ solid solution. Examples of the negative active materials include hard carbon, metals such as Si, Sn, Cd, Zn, Al, Bi, Pb, Ge, and Ag or alloys thereof, or chalcogenides containing these. SiO can be cited as an example of the chalcogenide. The technique of the present invention is applicable to the case where at least one of the positive active materials and negative active materials has the hysteresis.

The case 2 is made of a synthetic resin. The case 2 includes a main body 21, a lid 22 that closes an opening of the main body 21, a BMU housing 23 provided on an outer surface of the lid 22, a cover 24 covering the BMU housing 23, an inner lid 25, and a partition plate 26. The inner lid 25 and the partition plate 26 may not be provided.

The battery 3 is inserted between the partition plates 26 of the main body 21.

A plurality of bus bars 4 made of a metal are placed on the inner lid 25. The inner lid 25 is disposed on a terminal surface on which the terminal 32 of the battery 3 is provided, the adjacent terminals 32 of the adjacent batteries 3 are connected to each other by the bus bar 4, and the batteries 3 are connected in series.

The BMU housing 23 has a box shape, and includes a protrusion 23a protruding outward in a prismatic shape in a central portion of one long side surface. A pair of external terminals 5, 5 that are made of metal such as a lead alloy and has different polarities is provided on both sides of the protrusion 23a in the lid 22. The BMU 6 is configured by mounting an information processor 60, a voltage measuring unit 8, and a current measuring unit 9 on a substrate. The BMU 6 is housed in the BMU housing 23 and the BMU housing 23 is covered with the cover 24, whereby the battery 3 and the BMU 6 are connected to each other.

As illustrated in FIG. 10, the information processor 60 includes a CPU 62 and a memory 63.

The memory 63 stores an SOC estimation program 63a of the first embodiment and a table 63b. The SOC estimation program 63a is provided while stored in a computer-readable recording medium 70 such as a CD-ROM, DVD-ROM, and USB memory, and is stored in the memory 63 by installing the SOC estimation program 63a in the BMU 6. Alternatively, the SOC estimation program 63a may be acquired from an external computer (not illustrated) connected to a communication network, and stored in the memory 63.

The table 63b stores full first and second SOC-OCP data and full first and second SOC-OCV data. The SOC-OCP and the SOC-OCV may be stored as function expressions. Full first and second SOC-OCVs are acquired by the actual measurement at predetermined time intervals. The full first and second SOC-OCPs are obtained from the full first and second SOC-OCVs. The full first and second SOC-OCVs are updated as the degradation of the battery 3. The full first and second SOC-OCVs may be actually measured or estimated each time the battery 3 is used.

The CPU 62 performs an SOC estimation processing (to be described later) according to the SOC estimation program 63a read from the memory 63.

The voltage measuring unit 8 is connected to both ends of the battery 3 via a voltage detection line, and measures the voltage at each battery 3 at predetermined time intervals.

The current measuring unit 9 measures a current value passed through the battery 3 via the current sensor 7 at predetermined time intervals.

The external terminals 5, 5 of the battery module 1 are connected to a starter motor that starts the engine and a load 11 such as an electric component.

An electronic control unit (ECU) 10 is connected to the BMU 6 and the load 11.

The SOC estimation method of the first embodiment will be described below.

Figure 11:
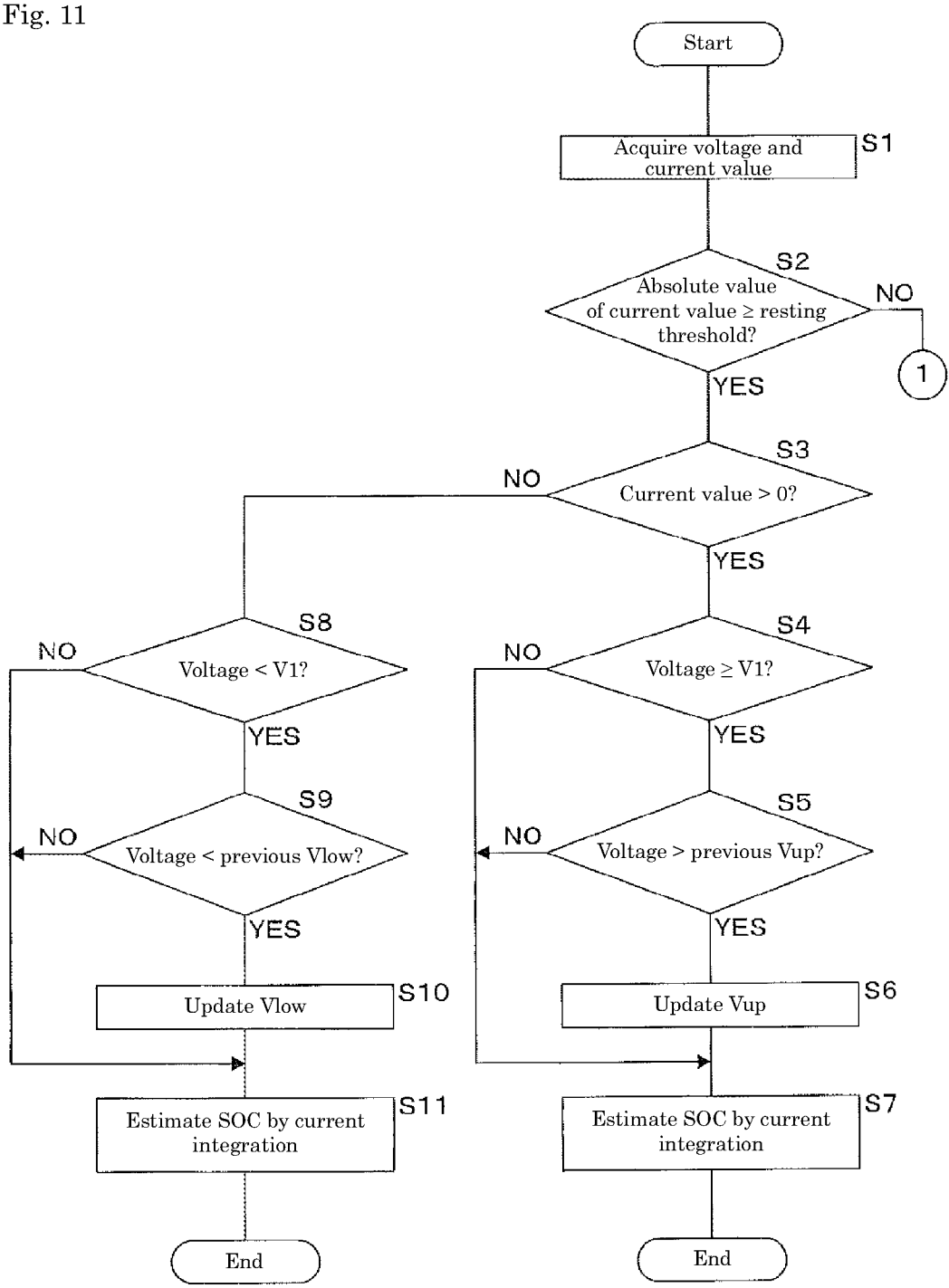
FIG. 11 is a flowchart illustrating a procedure of SOC estimation processing performed by the CPU.
Figure 12:
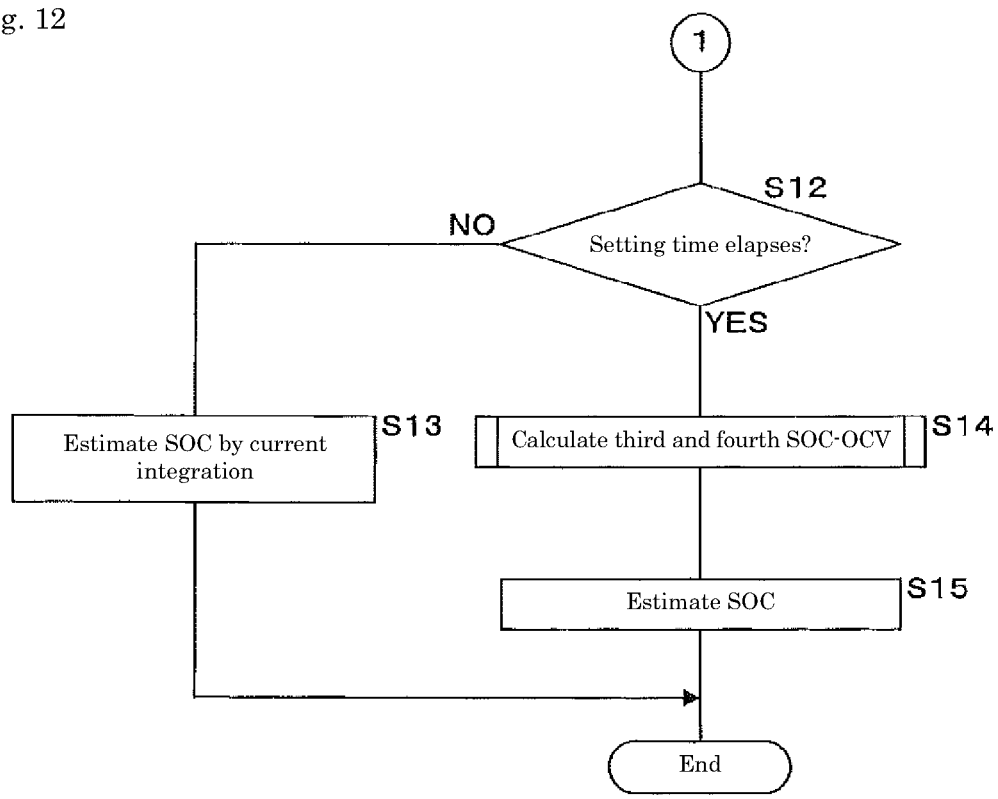
FIG. 12 is a flowchart illustrating the procedure of the SOC estimation processing by the CPU.

FIGS. 11 and 12 are flowcharts illustrating the procedure of the SOC estimation processing performed by the CPU 62. The CPU 62 repeats the pieces of processing from 51 at predetermined intervals or appropriate intervals.

The CPU 62 acquires the voltage value and the current value between the terminals of the battery 3 (S1). Because the first threshold V1 and the upper reference voltage Vup are the OCV, it is necessary to correct the acquired voltage to OCV when the battery 3 has the large current amount. The correction value to OCV is obtained by estimating the voltage at the current value of zero using a regression line from the data of the pluralities of voltage values and current values. When the amount of current flowing through the battery 3 is as small as a dark current (a minute current), the acquired voltage can be regarded as OCV.

The CPU 62 determines whether an absolute value of the current value is greater than or equal to a resting threshold (S2). The resting threshold is set in order to determine whether the battery 3 is in a charge state, a discharge state, or a resting state. When the CPU 62 determines that the absolute value of the current value is less than the resting threshold (NO in S2), the processing proceeds to S12.

When determining that the absolute value of the current value is greater than or equal to the resting threshold (YES in S2), the CPU 62 determines whether the current value is greater than zero (S3). The determination that the battery 3 is in the charge state is made when the current value is larger than zero. When the CPU 62 determines that the current value is not greater than zero (NO in S3), the processing proceeds to S8.

When determining that the current value is greater than zero (YES in S3), the CPU 62 determines whether the voltage is greater than or equal to V1 (S4). When the CPU 62 determines that the voltage value is less than V1 (NO in S4), the processing proceeds to S7.

When determining that the voltage is greater than or equal to V1 (S4: YES), the CPU 62 determines whether the acquired voltage is greater than Vup previously stored in the memory 63 (S5). When the CPU 62 determines that the voltage is less than or equal to the previous Vup (NO in S5), the processing proceeds to S7.

When determining that the voltage is greater than the previous Vup (YES in S5), the CPU 62 updates the voltage to Vup in the memory 63 (S6).

The CPU 62 estimates the SOC by the current integration (S7), and ends the processing.

When determining that the current value is less than zero while the battery 3 is in the discharge state (NO in S3), the CPU 62 determines whether the voltage is less than V1 (S8). When the CPU 62 determines that the voltage value is greater than or equal to V1 (NO in S8), the processing proceeds to S11.

When determining that the voltage is less than V1 (YES in S8), the CPU 62 determines whether the acquired voltage is less than a lower reference voltage Vlow previously stored in the memory 63 (S9).

When the CPU 62 determines that the voltage is greater than or equal to the previous Vlow (NO in S9), the processing proceeds to S11.

When determining that the voltage is less than the previous Vlow (YES in S9), the CPU 62 updates the voltage to Vlow in the memory 63 (S10).

The CPU 62 estimates the SOC by the current integration (S11), and ends the processing.

When determining that the absolute value of the current value is less than the resting threshold while the battery 3 is in the resting state (NO in S2), the CPU 62 determines whether a setting time elapses (S12). The setting time sufficient to consider the acquired voltage as the OCV is obtained by an experiment. The CPU 62 determines whether the setting time elapses based on the number of acquisition times and the acquisition interval of the voltage value and the current value after the battery 3 is determined to be in the resting state. Consequently, the SOC can be estimated with higher accuracy in the resting state.

When determining that the setting time does not elapse (NO in S12), the CPU 62 estimates the SOC by the current integration (S13), and ends the processing.

When the CPU 62 determines that the setting time elapses (YES in S12), the acquired voltage can be regarded as the OCV.

The CPU 62 calculates the third and fourth SOC-OCVs (S14).

The third and fourth SOC-OCVs calculated last time can be used when Vup and Vlow do not change from those of the previous estimation of the SOC by the voltage reference.

Figure 13:
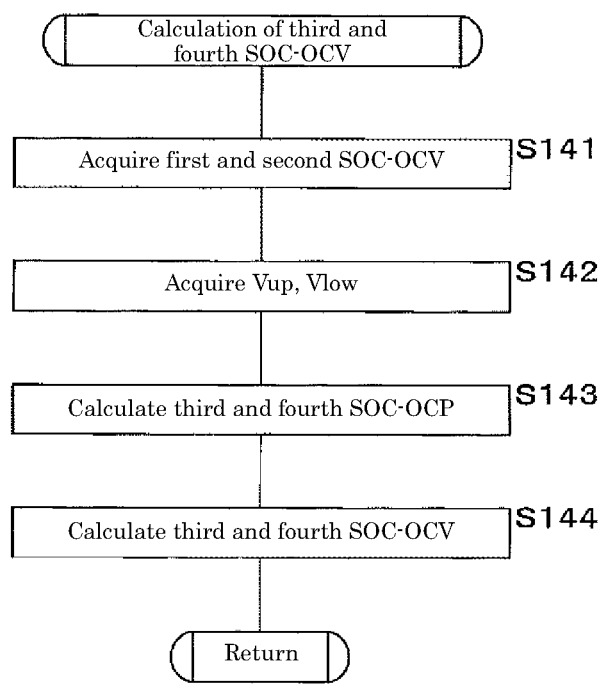
FIG. 13 is a flowchart illustrating a processing procedure of a subroutine calculating the third and fourth SOC-OCVs.

FIG. 13 is a flowchart illustrating a processing procedure of a subroutine calculating the third and fourth SOC-OCVs.

The CPU 62 reads the first SOC-OCP and the second SOC-OCP from the table 63b (S141).

The CPU 62 reads Vup and Vlow from the memory 63 (S142). The CPU 62 converts Vup and Vlow into the positive potentials Vup' and Vlow'.

The CPU 62 grasps the charge-discharge history until the resting state is reached from the update history of Vup and Vlow, and calculates the third SOC-OCP or the fourth SOC-OCP in the corresponding region as described above (S143).

The CPU 62 calculates the third SOC-OCV or the fourth SOC-OCV based on the third SOC-OCP or the fourth SOC-OCP (S144), and returns.

The CPU 62 reads the SOC corresponding to the voltage acquired in S1 in the third and fourth SOC-OCVs to estimate the SOC (S15), and ends the processing.

Only the full first and second SOC-OCVs may be stored in the table 63b of the memory 63, and the third SOC-OCV or the fourth SOC-OCV may directly be calculated without going through the third SOC-OCP or the fourth SOC-OCP.

The voltage acquired from the voltage measuring unit 8 by the CPU 62 varies somewhat depending on the current value, so that the voltage can be corrected by obtaining a correction coefficient through the experiment.

Figure 14:
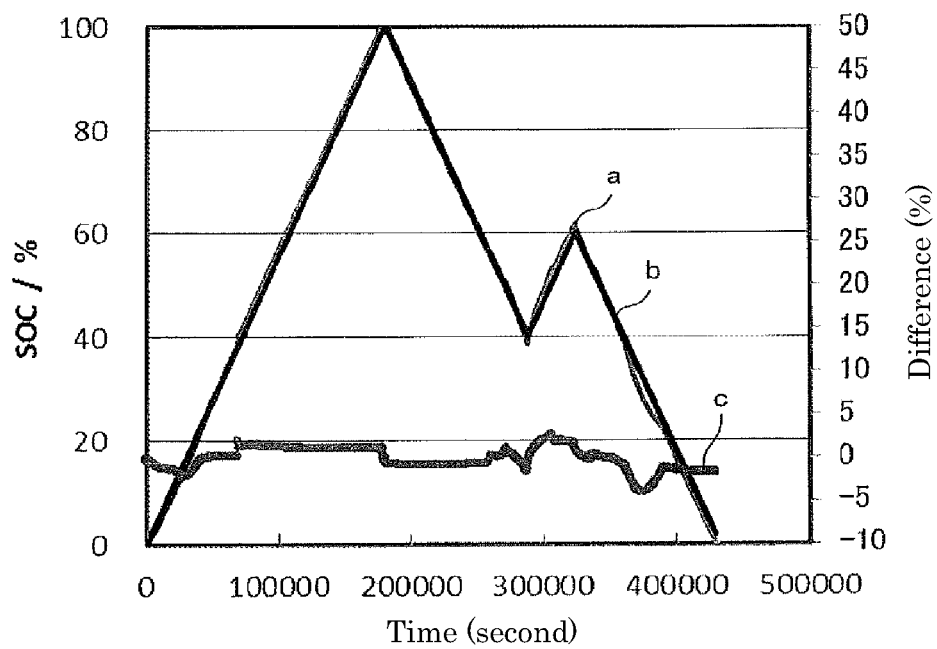
FIG. 14 is a graph illustrating a difference between the estimation of the SOC by voltage reference and the estimation of the SOC by current integration when charge-discharge is performed on a new battery with a pattern of SOC: 0%→100%→40%→60%→0%.

FIG. 14 is a graph illustrating the difference between the estimation of the SOC by the voltage reference and the estimation of the SOC by the current integration when the charge-discharge is performed on the new battery 3 with the pattern of the SOC: 0%→100%→40%→60%→0%. The horizontal axis indicates time (second), the left vertical axis indicates SOC (%), and the right vertical axis indicates the difference (%). When the SOC is estimated by the voltage reference, Vup is corrected under the above predetermined condition. The same applies hereinafter.

In the estimation of the SOC by the current integration as a control, the discharge capacity is previously checked and a highly accurate ammeter is used, so that the discharge capacity of Q and the current value of I in equation (1) are accurate. In this case, it is considered that the discharge capacity of Q and the current value of I approximate the true values.

In FIG. 14, a is transition of the SOC obtained by the voltage reference of the embodiment, b is transition of the SOC obtained by the current integration, and c is a difference between the both. c is represented by the following equation.

$$\text{Difference (\%)} = \text{SOC estimated by voltage reference (\%)} - \text{SOC estimated by current integration (\%)}$$

As can be seen from FIG. 14, the difference ranges from about −4% to 2%, and is small.

Figure 15:
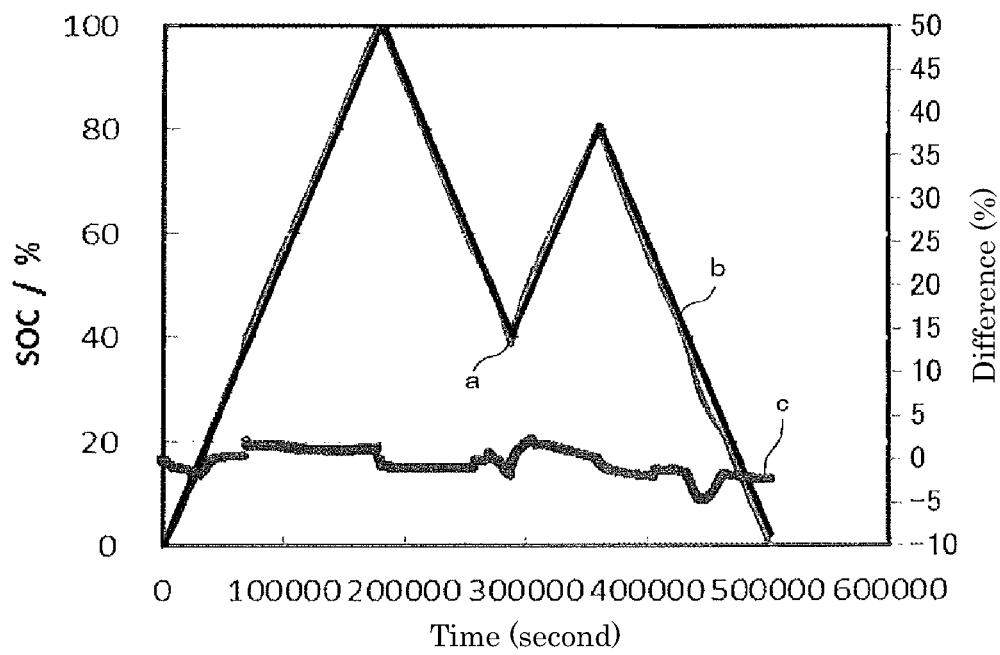
FIG. 15 is a graph illustrating the difference between the estimation of the SOC by the voltage reference and the estimation of the SOC by the current integration when the charge-discharge is performed on the new battery with the pattern of SOC: 0%→100%→40%→80%→0%.

FIG. 15 is a graph illustrating the difference between the estimation of the SOC by the voltage reference and the estimation of the SOC by the current integration when the charge-discharge is performed on the new battery 3 with the pattern of the SOC: 0%→100%→40%→80%→0%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 15, the difference ranges from about −5% to 2%, and is small.

Figure 16:
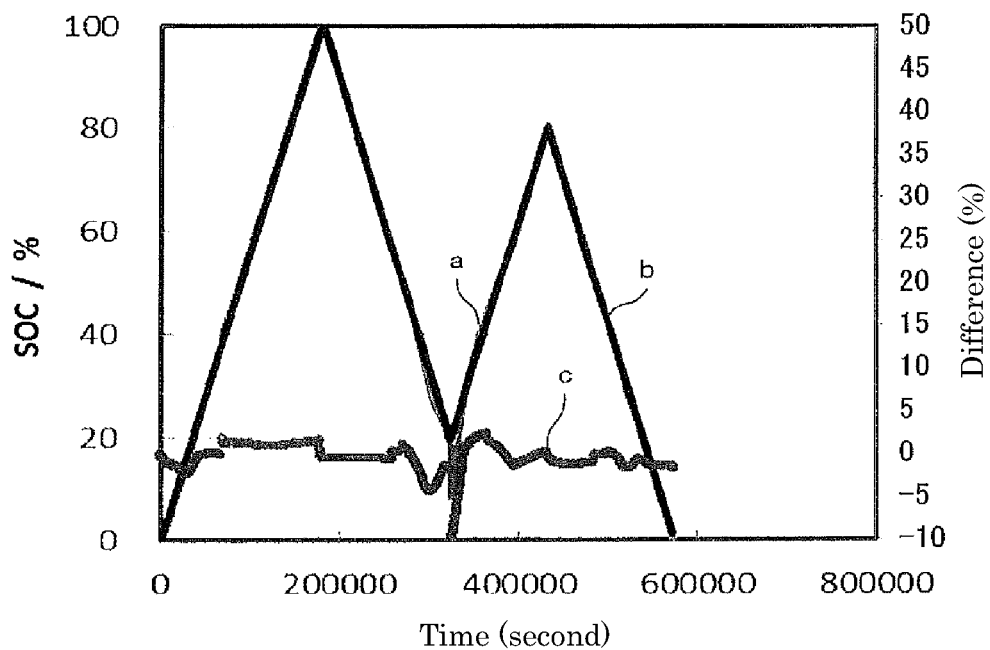
FIG. 16 is a graph illustrating the difference between the estimation of the SOC by the voltage reference and the estimation of the SOC by the current integration when the charge-discharge is performed on the new battery with the pattern of SOC: 0%→100%→20%→80%→0%.

FIG. 16 is a graph illustrating the difference between the estimation of the SOC by the voltage reference and the estimation of the SOC by the current integration when the charge-discharge is performed on the new battery 3 with the pattern of the SOC: 0%→100%→20%→80%→0%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 16, the difference ranges from about −5% to 2%, and is small.

Figure 17:
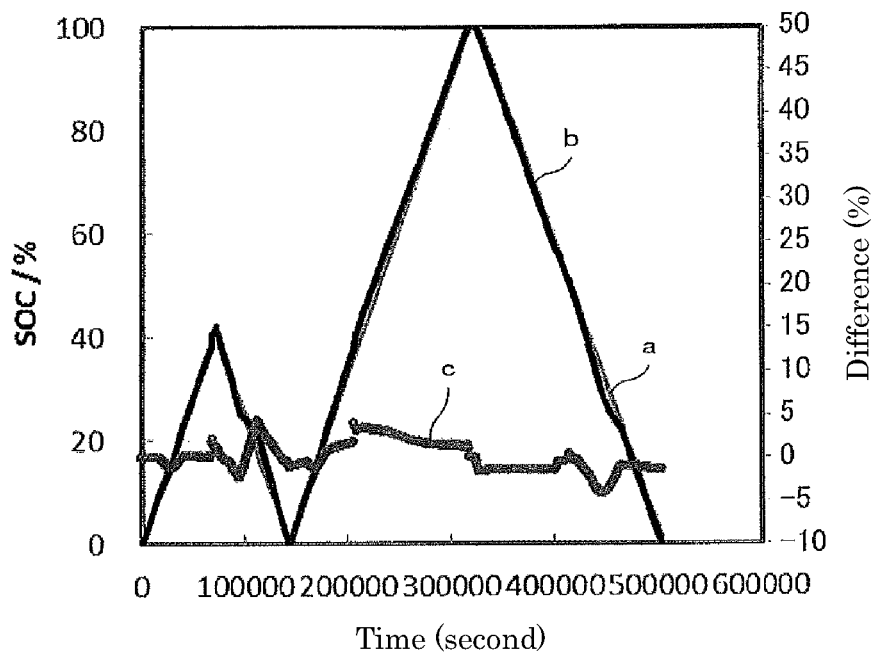
FIG. 17 is a graph illustrating the difference between the estimation of the SOC by the voltage reference and the estimation of the SOC by the current integration when the charge-discharge is performed on the new battery with the pattern of the SOC: 0%→40%→20%.

FIG. 17 is a graph illustrating the difference between the estimation of the SOC by the voltage reference and the estimation of the SOC by the current integration when the charge-discharge is performed on the new battery 3 with the pattern of the SOC: 0%→40%→20%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 17, the difference ranges from about −4% to 5%, and is small.

Figure 18:
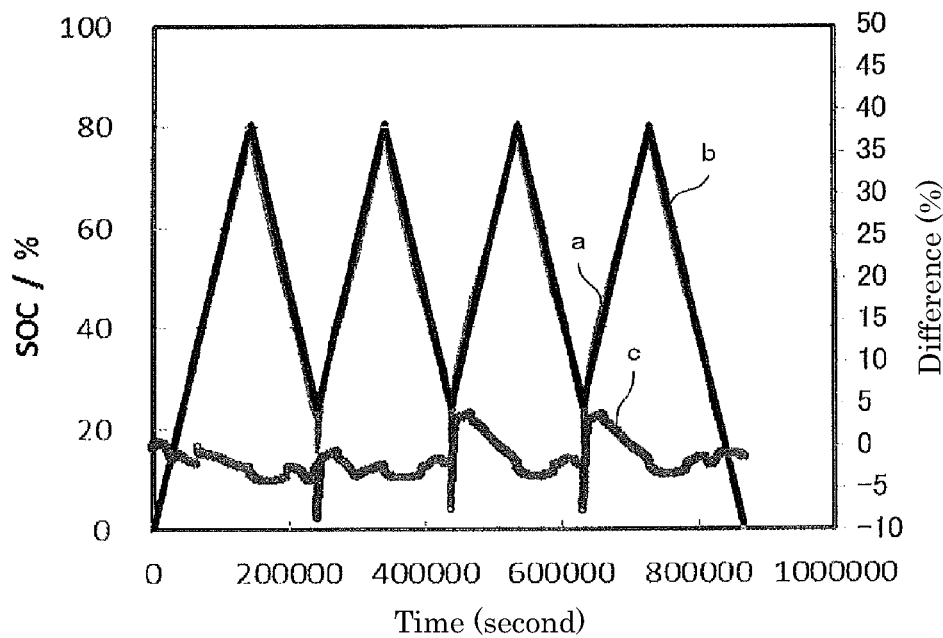
FIG. 18 is a graph illustrating the difference between the estimation of the SOC by the voltage reference and the estimation of the SOC by the current integration when the charge-discharge is performed on the new battery with the pattern of the SOC: 0%→81%→24%→81%→25%→81%→25%→80%→0%.

FIG. 18 is a graph illustrating the difference between the estimation of the SOC by the voltage reference and the estimation of the SOC by the current integration when the charge-discharge is performed on the new battery 3 with the pattern of the SOC: 0%→81%→24%→81%→25%→81%→25%→80%→0%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 18, the difference ranges from about −9% to 3%, and is small. For example, an error of 9% is generated when the discharge is switched to the charge in the low SOC region. In such cases, complement may be performed by the current integration method.

Figure 19:
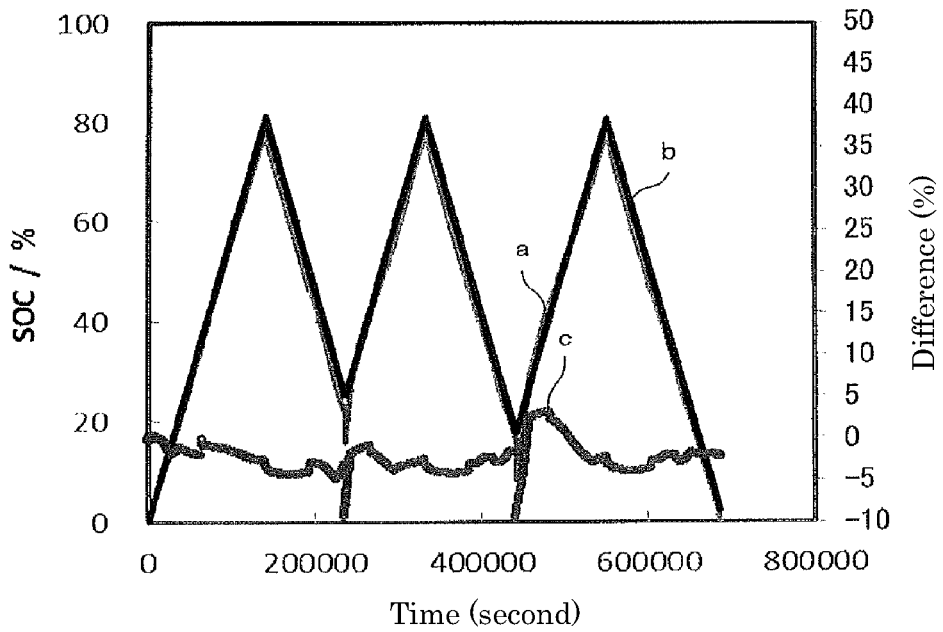
FIG. 19 is a graph illustrating the difference between the estimation of the SOC by the voltage reference and the estimation of the SOC by the current integration when the charge-discharge is performed on the new battery with the pattern of the SOC: 0%→81%→25%→81%→18%→81%→0%.

FIG. 19 is a graph illustrating the difference between the estimation of the SOC by the voltage reference and the estimation of the SOC by the current integration when the charge-discharge is performed on the new battery 3 with the pattern of the SOC: 0%→81%→25%→81%→18%→81%→0%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 19, the difference ranges from about −9% to 3%, and is small.

Figure 20:
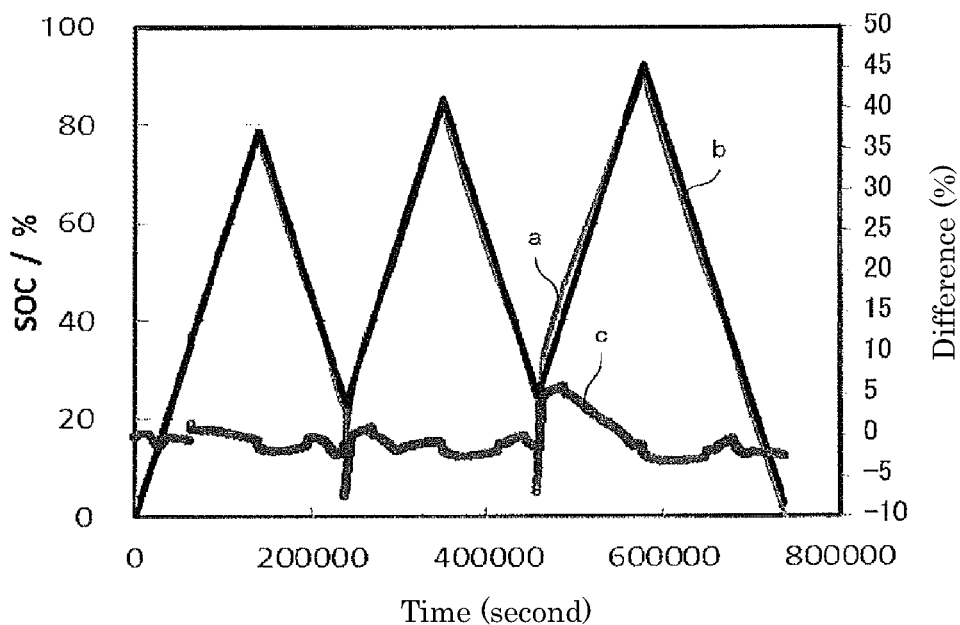
FIG. 20 is a graph illustrating the difference between the estimation of the SOC by the voltage reference and the estimation of the SOC by the current integration when the charge-discharge is performed on the new battery with the pattern of the SOC: 0%→79%→23%→86%→25%→93%→0%.

FIG. 20 is a graph illustrating the difference between the estimation of the SOC by the voltage reference and the estimation of the SOC by the current integration when the charge-discharge is performed on the new battery 3 with the pattern of the SOC: 0%→79%→23%→86%→25%→93%→0%. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 20, the difference ranges from about −10% to 6%, and is small.

Figure 21:
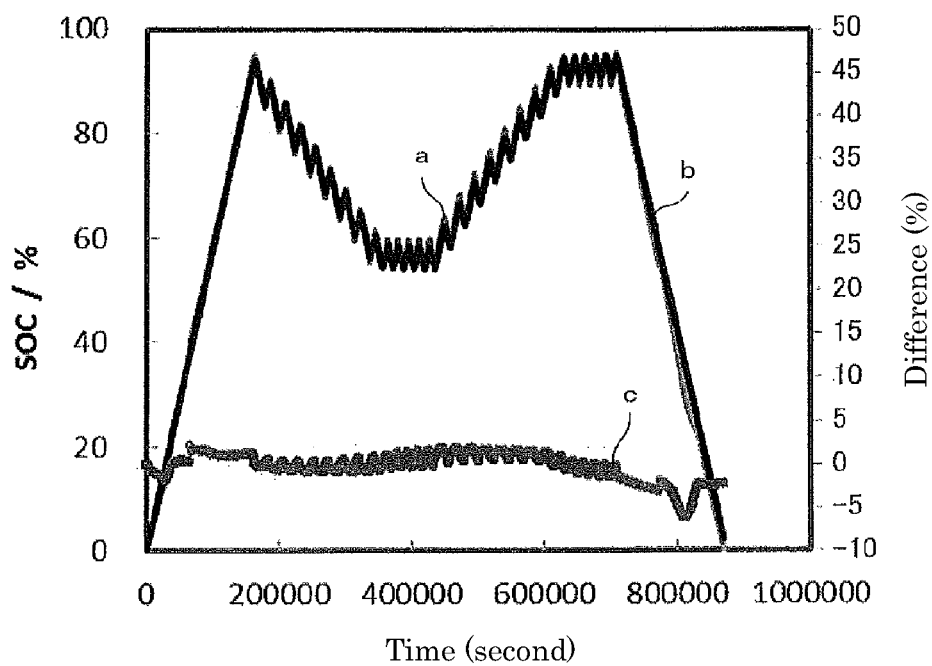
FIG. 21 is a graph illustrating the difference between the estimation of the SOC by the voltage reference and the estimation of the SOC by the current integration when the charge-discharge is performed on the new battery with the pattern of the SOC: 0%→94%→56%→94%→0%.

FIG. 21 is a graph illustrating the difference between the estimation of the SOC by the voltage reference and the estimation of the SOC by the current integration when the charge-discharge is performed on the new battery 3 with the pattern of the SOC: 0%→94%→56%→94%→0%. In SOC: 94→56%, the discharge of SOC 8% and the charge of SOC 4% were repeated until the SOC reached 56%. After the SOC reached 56%, the charge of SOC 4% and the discharge of SOC 4% were repeated five times. In SOC: 56→94%, the charge of SOC 8% and the discharge of SOC 4% were repeated until the SOC reached 94%. After the SOC reached 94%, the discharge of SOC 4% and the charge of SOC 4% were repeated five times. The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 21, the difference ranges from about −7% to 2%, and is small.

Figure 22:
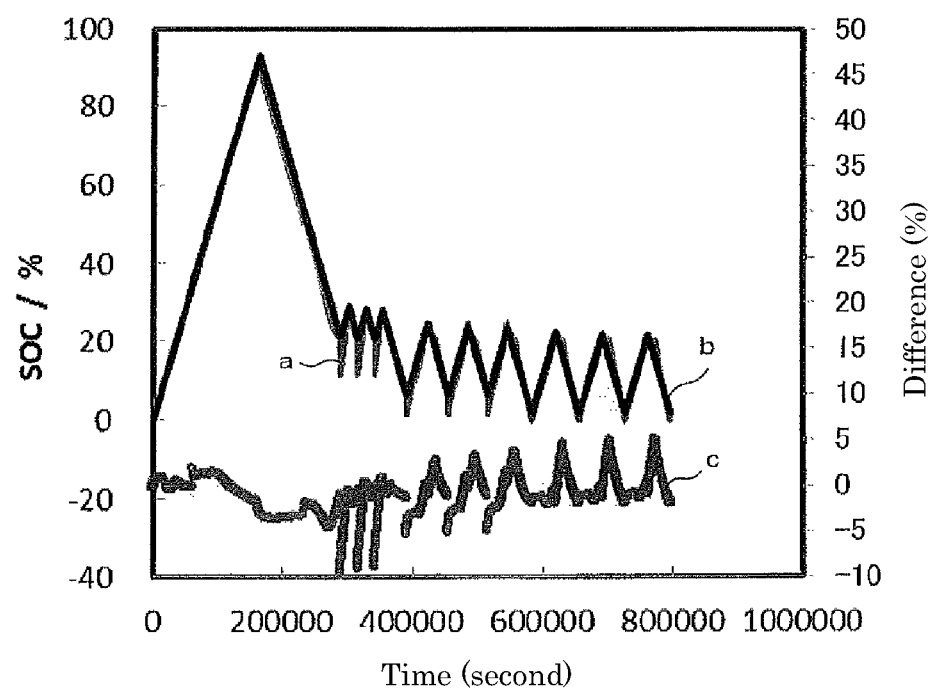
FIG. 22 is a graph illustrating the difference between the estimation of the SOC by the voltage reference and the estimation of the SOC by the current integration when the charge-discharge is performed on the new battery with the pattern of the OC: 0%→93%→(21⇔29)×3%→(6 ⇔24)×3%→(0⇔22)×3%.

FIG. 22 is a graph illustrating the difference between the estimation of the SOC by the voltage reference and the estimation of the SOC by the current integration when the charge-discharge is performed on the new battery 3 with the pattern of SOC: 0→93%→(21⇔29)×3%→(6⇔24)×3%→(0⇔22)×3%.

The horizontal axis indicates time (second), the left vertical axis indicates SOC (%), and the right vertical axis indicates the difference (%).

In FIG. 14, a is transition of the SOC obtained by the voltage reference of the embodiment, b is transition of the SOC obtained by the current integration, and c is a difference between the both.

As can be seen from FIG. 22, the difference ranges from about −10% to 5%, and is small.

From the above, it was confirmed that the error is small between the estimation of the SOC by the voltage reference of the first embodiment and the estimation of the SOC by the current integration of the control, and the estimation of the SOC by the voltage reference of the first embodiment has high accuracy.

As described above, the reference SOC-OCV can be obtained based on the charge-discharge history and the full SOC-OCP in consideration of the oxidation and the reduction of the reaction of A and the reaction of B that are generated during the charge and the discharge in the whole potential range in the single electrode. Whether the region where one electrochemical reaction is generated is reached is grasped based on the voltage increase and decrease during the charge-discharge.

In the embodiment, the third SOC-OCV or the fourth SOC-OCV is generated based on the Vup stored in the memory 63 and the first SOC-OCP or the second SOC-OCP. It is not necessary to store the third and fourth SOC-OCVs in the memory 63 by the actual measurement for each Vup. That is, the third and fourth SOC-OCVs can easily be obtained in the whole region. Only the first and second SOC-OCVs are actually measured, and the first and second charge-discharge OC-OCVs may be estimated, so that the workload is significantly reduced.

When the third and fourth SOC-OCVs are calculated according to the degradation of the battery 3, only the first and second SOC-OCVs are actually measured or estimated, and the workload is small during the usage period of the battery 3.

In the embodiment, the SOC can be estimated on any one of the charge and the discharge, the high potential side, and the low potential side. By calculating the third and fourth SOC-OCVs based on Vup and V1, the SOC can be estimated based only on the voltage history when the charge-discharge is repeated in a complicated pattern. Unlike Patent Document 1 in which the SOC-OCV curve is selected based on the final voltage during the charge by updating Vup when the acquired voltage exceeds the previous Vup, a remaining amount of the oxidant generated by the reaction of A can be taken into account, and the SOC can be estimated with high accuracy.

Because the voltage can be used, the storage amount is not limited to the SOC. Depth of discharge (DOD) can be used. An amount of current energy stored in the energy storage device such as electric energy can be estimated. The dischargeable energy up to SOC 0% and the charge energy required up to SOC 100% can be predicted based on the charge-discharge characteristic. That is, the remaining electric energy and the storable power amount can be estimated at this time.

Thus, balancing during the use of the plurality of batteries 3, control of regeneration acceptance, estimation of the travel distance of the vehicle, and the like can be performed with high accuracy.

The present invention is not limited to the contents of the above embodiment, but various modifications can be made within the scope of the claims. That is, an embodiment obtained by combining technical means appropriately changed within the scope of the claims is also included in the technical scope of the present invention.

In the embodiment, by way of example, the positive electrode includes the active material having the hysteresis. However, when the negative electrode includes the active material having the hysteresis, similarly the reference SOC-OCV can be obtained to estimate the SOC.

One electrochemical reaction and another electrochemical reaction occur are not limited to the embodiment. The method of obtaining the potential region and the starting point in each region is determined depending on the charge and discharge and the reaction of the active material on the high potential side and the low potential side.

The estimation of the storage amount by the voltage reference of the present invention is not limited to the case where the estimation is performed during the rest, but may be performed in real time during the charge or the discharge. In this case, the OCV is calculated at this time from the acquired voltage and current values. The OCV can be calculated by estimating the voltage at the current value of zero using the regression line from the data of the pluralities of voltage values and current values. When the current value is as small as a dark current value, the acquired voltage can be read as the OCV.

The case where the storage amount estimation device of the present invention is applied to the in-vehicle lithium ion secondary battery is illustrated. Alternatively, the present invention can be applied to other energy storage modules such as a railway regenerative power storage device and a solar power generating system. The voltage between the positive electrode terminal and the negative electrode terminal of the energy storage device can be regarded as the OCV in the energy storage module through which a minute current flows.

The energy storage device is not limited to the lithium ion secondary battery, but may be another secondary battery or an electrochemical cell having the hysteresis characteristic.

By way of example, the monitoring device 100 or the BMU 6 is the storage amount estimation device. Alternatively, a cell monitoring unit (CMU) may be the storage amount estimation device. The storage amount estimation device may be a part of the energy storage module in which the monitoring device 100 or the like is incorporated. The storage amount estimation device may be configured separately from the energy storage device or the energy storage module, and connected to the energy storage module including the energy storage device that is the estimation target of the heat storage amount during the estimation of the heat storage amount. The heat storage amount estimation device may remotely monitor the energy storage device and the energy storage module.

DESCRIPTION OF REFERENCE SIGNS

1, 50 battery module (energy storage module)
2 case
21 main body
22 lid
23 BMU housing
24 cover
25 inner lid
26 partition plate
3, 200 battery (energy storage device)
31 case
32 terminal
33 electrode assembly
4 bus bar
5 external terminal
6 BMU (storage amount estimation device)
60 information processor
62 CPU (first acquisition unit, estimation unit, second acquisition unit, setting unit)
63 memory (storage unit)
63*a* SOC estimation program
63*b* table
70 recording media
7 current sensor
8 voltage measuring unit
9 current value measuring unit
10 ECU
100 monitoring device (storage amount estimation device)
300 case

The invention claimed is:

1. A storage amount estimation device that estimates a storage amount of an energy storage device containing an active material in a positive electrode and/or a negative electrode, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic, the storage amount estimation device comprising:
   a first acquisition unit that acquires a third characteristic that is a storage amount-voltage charge characteristic and/or a fourth characteristic that is a storage amount-voltage discharge characteristic based on the first characteristic, the second characteristic, and voltage history of the charge-discharge, the third characteristic and the fourth characteristic being for reference in estimating the storage amount from an acquired voltage;
   an estimation unit that estimates the storage amount based on the voltage history of the charge-discharge, at least one of the third characteristic or the fourth characteristic, and the acquired voltage;
   a second acquisition unit that acquires voltage at the energy storage device; and
   a setting unit that sets voltage acquired after the voltage acquired by the second acquisition unit is greater than a first threshold to a reference voltage,
   wherein the first acquisition unit acquires at least one of the third characteristic or the fourth characteristic based on the reference voltage.

2. The storage amount estimation device according to claim 1, wherein the first acquisition unit acquires the third characteristic or the fourth characteristic using the first characteristic or the second characteristic in a plurality of regions defined by voltage that changes according to the transition of the charge-discharge.

3. The storage amount estimation device according to claim 1, wherein the setting unit
   stores the reference voltage in a storage unit, and
   updates the acquired voltage to the reference voltage when the voltage acquired by the second acquisition unit is greater than the reference voltage previously stored in the storage unit.

4. The storage amount estimation device according to claim 3, wherein, in a region from the first threshold to the reference voltage, the first acquisition unit sets the storage amount of the first characteristic at the reference voltage to an upper limit and acquires the third characteristic using the second characteristic.

5. The storage amount estimation device according to claim 3, wherein, in a region from the first threshold to a second threshold smaller than the first threshold, the first acquisition unit sets the storage amount at the first threshold to an upper limit and acquires the third characteristic using the first characteristic, and
wherein the storage amount at the first threshold=(the storage amount at the reference voltage of the first characteristic)−{(the storage amount at the reference voltage of the second characteristic)−(the storage amount at the first threshold of the second characteristic)}.

6. The storage amount estimation device according to claim 1, wherein, in a region from the first threshold to the reference voltage, the first acquisition unit sets the storage amount of the first characteristic at the reference voltage to an upper limit and acquires the third characteristic using the second characteristic.

7. The storage amount estimation device according to claim 6, wherein, in a region from the first threshold to a second threshold smaller than the first threshold, the first acquisition unit sets the storage amount at the first threshold to an upper limit and acquires the third characteristic using the first characteristic, and
wherein the storage amount at the first threshold=(the storage amount at the reference voltage of the first characteristic)−{(the storage amount at the reference voltage of the second characteristic)−(the storage amount at the first threshold of the second characteristic)}.

8. The storage amount estimation device according to claim 1, wherein, in a region from the first threshold to a second threshold smaller than the first threshold, the first acquisition unit sets the storage amount at the first threshold to an upper limit and acquires the third characteristic using the first characteristic, and
wherein the storage amount at the first threshold=(the storage amount at the reference voltage of the first characteristic)−{(the storage amount at the reference voltage of the second characteristic)−(the storage amount at the first threshold of the second characteristic)}.

9. An energy storage module comprising:
an energy storage device; and
the storage amount estimation device according to claim 1.

10. A storage amount estimation method for estimating a storage amount of an energy storage device containing an active material in a positive electrode and/or a negative electrode, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic, the storage amount estimation method comprising:
storing the first characteristic, the second characteristic, and voltage history of the charge-discharge in a storage unit;
acquiring voltage at the energy storage device and setting voltage acquired after the acquired voltage is greater than a first threshold to a reference voltage;
acquiring a third characteristic that is a storage amount-voltage charge characteristic and/or a fourth characteristic that is a storage amount-voltage discharge characteristic for reference, the third characteristic and the fourth characteristic being for reference in estimating the storage amount from the acquired voltage, at least one of the third characteristic or the fourth characteristics is acquired based on the reference voltage; and
estimating the storage amount based on the voltage history of the charge-discharge, the third characteristic and/or the fourth characteristic, and the acquired voltage.

11. The storage amount estimation method of claim 10, further comprising the steps of:
storing the reference voltage in a storage unit, and
updating the acquired voltage to the reference voltage when the voltage acquired is greater than the reference voltage previously stored in the storage unit.

12. The storage amount estimation method of claim 10, wherein, in a region from the first threshold to the reference voltage, the storage amount of the first characteristic at the reference voltage is set to an upper limit and the third characteristic is acquired using the second characteristic.

13. The storage amount estimation method of claim 10, wherein:
in a region from the first threshold to a second threshold smaller than the first threshold, the storage amount at the first threshold is set to an upper limit and the third characteristic is acquired using the first characteristic, and
the storage amount at the first threshold=(the storage amount at the reference voltage of the first characteristic)−{(the storage amount at the reference voltage of the second characteristic)−(the storage amount at the first threshold of the second characteristic)}.

14. A non-transitory computer-readable medium storing a computer program causing a computer that estimates a storage amount of an energy storage device containing an active material in a positive electrode and/or a negative electrode to perform pieces of processing, the active material generating a plurality of electrochemical reactions according to transition of charge-discharge, the active material exhibiting hysteresis between a first characteristic that is a storage amount-voltage charge characteristic and a second characteristic that is a storage amount-voltage discharge characteristic, the pieces of processing comprising:
acquiring voltage at the energy storage device and setting voltage acquired after the acquired voltage is greater than a first threshold to a reference voltage;
acquiring a third characteristic that is a storage amount-voltage charge characteristic and/or a fourth characteristic that is a storage amount-voltage discharge characteristic for reference by referring to the first characteristic, the second characteristic, and voltage history of the charge-discharge, the third characteristic and the fourth characteristic being for references in estimating the storage amount from the acquired voltage, at least one of the third characteristic or the fourth characteristics is acquired based on the reference voltage;
estimating the storage amount based on the voltage history of the charge-discharge, the third characteristic and/or the fourth characteristic, and the acquired voltage.

15. The non-transitory computer-readable medium of claim 14, further comprising:
- storing the reference voltage in a storage unit, and
- updating the acquired voltage to the reference voltage when the voltage acquired is greater than the reference voltage previously stored in the storage unit.

16. The non-transitory computer-readable medium of claim 14, wherein, in a region from the first threshold to the reference voltage, the storage amount of the first characteristic at the reference voltage is set to an upper limit and the third characteristic is acquired using the second characteristic.

17. The non-transitory computer-readable medium of claim 14, wherein:
- in a region from the first threshold to a second threshold smaller than the first threshold, the storage amount at the first threshold is set to an upper limit and the third characteristic is acquired using the first characteristic, and
- the storage amount at the first threshold=(the storage amount at the reference voltage of the first characteristic)−{(the storage amount at the reference voltage of the second characteristic)−(the storage amount at the first threshold of the second characteristic)}.

* * * * *